United States Patent [19]

Nakajima

[11] Patent Number: 5,638,075

[45] Date of Patent: Jun. 10, 1997

[54] SUCCESSIVE APPROXIMATION ADC WITH ROUNDING TO VARY BIT NUMBER OUTPUT

[75] Inventor: Toyokatsu Nakajima, Itami, Japan

[73] Assignees: Mitsubishi Denki Kabushiki Kaisha, Tokyo; Mitsubishi Electric Semiconductor Software Co., Ltd., Hyogo, both of Japan

[21] Appl. No.: 503,356

[22] Filed: Jul. 17, 1995

[30] Foreign Application Priority Data

Oct. 31, 1994 [JP] Japan ................................. 6-267000

[51] Int. Cl.[6] ........................................................ H03M 1/00
[52] U.S. Cl. ........................................ 341/163; 341/155
[58] Field of Search .................................. 341/118, 155, 341/161, 162, 163, 160

[56] References Cited

U.S. PATENT DOCUMENTS

| | | | |
|---|---|---|---|
| 4,553,128 | 11/1985 | Pilost | 341/161 |
| 4,823,130 | 4/1989 | Wright et al. | 341/162 |
| 5,262,779 | 11/1993 | Sauer et al. | 341/161 |

Primary Examiner—Howard L. Williams
Attorney, Agent, or Firm—Lowe, Price, LeBlanc & Becker

[57] ABSTRACT

An analog/digital (A/D) converter includes a sequential approximation register (SA register) having a plurality of bits for storing the results of conversion in digits and an incrementor having a smaller number of bits than that of the SA register. The incrementor increments a portion of the results of conversion on the basis of the result of conversion of at least one bit in the SA register so as to minimize an error in the A/D conversion of a smaller number of bits than that of the SA register.

16 Claims, 24 Drawing Sheets

5,638,075

SUCCESSIVE APPROXIMATION ADC WITH ROUNDING TO VARY BIT NUMBER OUTPUT

BACKGROUND OF THE INVENTION

1. Field of the Invention

The present invention relates generally to an analog/digital converter, hereinafter referred to as "A/D converter", and more particularly to an A/D converter which converts analog voltage into digital value even if the lower-order bits of it are cut off.

2. Description of the Related Art

It is known in the art that single-chip microcomputers used in industry and homes is equipped with an A/D converter which converts analog voltage detected by various sensors into digital values. There are many kinds of sensors depending upon applications such as thermosensors, hygrometric sensors and barometric sensors.

In recent years, as microcomputer-based products are becoming more sophisticated and having multi-functions, the built-in A/D converters are required to have as high resolution as in the 10-bit order. However, all the output voltage of the sensors need not be converted into 10-bit digital values, but some sensors may be less precise. For example, in the case of an 8-bit CPU, an 8-bit data can be processed by an A/D converter at one time. In contrast, a 10-bit data must be divided into two parts, and taken in twice part by part, thereby taking a longer time for reading data in digit converted by the A/D converter. It is common practice to take in a data in the 10-bit order when high precision is required, and to take in an 8-bit data when less precision suffices. In this way, the conventional microcomputer-based appliances try to maintain efficiency by averaging the performance.

The way to obtain an 8-bit conversion by using a 10-bit A/D converter consists mainly of reading out exclusively the results of the high-order 8-bits conversion and ignoring the low-order two bits.

Referring to FIG. 1, which shows a construction of a general-purpose sequential comparison type A/D converter built in a microcomputer, an analog voltage AN to be converted is inputted to an input terminal of a comparator 1, and a comparison voltage outputted by the D/A convertor division 2 is input to the other input terminal of the comparator 1. The D/A converting division 2 includes a ladder resistor. The comparator 1 has a control terminal to which a control signal from a control circuit 3 is inputted. The results of comparison obtained by the comparator 1 are stored in a sequential approximation SA register 4 (hereinafter called "SA register 4"), and the conversion conducted by the SA register 4 is inputted to the D/A converting division 2. The SA register 4 is supplied with an address by an address decoder 5, and the conversion conducted by the SA register 4 is outputted to a data bus DB.

Now, referring to FIG. 2, which shows a schematic internal structure of the SA register 4, the SA register 4 is composed of 10 bits from MSB (most significant bit) $b_9$ to LSB (least significant bit) $b_0$, and includes a control division 4a for controlling its operation.

This type of A/D converter is operated as follows:

The control circuit 3 outputs a control signal to operate the A/D converter, thereby causing it to sets "1" at the MSB $b_9$ in the SA register 4. Then the D/A convertor division 2 outputs a reference voltage (1/2) $V_{ref}$. The comparator 1 compares the target analog voltage AN with the reference voltage (1/2) $V_{ref}$. If the target analog voltage AN is smaller than the reference voltage, the MSB $b_9$ is reset, and if it is larger than it, the MSB $b_9$ is kept in its set state.

Then, "1" is set at the 2nd bit $b_8$ in the higher order. If "1" is already set at the MSB, the D/A convertor division 2 outputs a reference voltage (3/4) $V_{ref}$, and if not yet, a reference voltage (1/4) $V_{ref}$ is outputted. In this way, the comparator 1 conducts the 2nd comparison between the analog voltage AN and the reference voltage. If the comparison finds that the target analog voltage AN is smaller than the reference voltage, the 2nd-bit $b_8$ is reset, and if the comparison finds that the target analog voltage is larger, the 2nd-bit $b_8$ is kept in its set state. After the same procedures are repeated ten times, the target analog voltage is converted into 10-bit digital value. Then the address decoder 5 inputs an address in the SA register 4, and outputs the conversion thereof to the data bus DB.

In this ray, the SA register 4 selectively controls the taps of the ladder resistor circuits for the D/A convertor division 2 while the A/D conversion is proceeding. Finally the SA register 4 stores the results of the A/D conversion. The characteristics of the 10-bit A/D conversion are shown in FIG. 3 where the X-axis indicates the analog voltages of the low-order 4-bit in terms of digital values, and the Y-axis indicates the results of conversion of low-order 4-bit. In FIG. 3 the ladder-like fine line represents ideal A/D conversion characteristics obtainable when a 10-bit conversion is practiced. The ladder-like dotted lines represent the ideal conversion characteristics obtainable when an 8-bit conversion is practiced. The ladder-like thick line represents the 8-bit conversion obtainable when after a 10-bit conversion is finished, the low-order two bits are rounded off.

There are another type of A/D converters which are provided with at least one register especially for storing the results of conversion. However, the addition of such special registers does not give any favorable influence on the performance of the SA register 4 but it only increases the number of step for transmitting the results of conversion to the storage register.

As is evident from the foregoing, when the A/D conversion is practiced by a 10-bit converter and the low-order two bits are rounded off, the resulting characteristics is not satisfactory as indicated by the full lines in FIG. 3, which is different from the ideal one indicated in the dotted lines obtained by using an 8-bit A/D converter. This unavoidably involves an error by (3/8) LSB.

SUMMARY OF THE INVENTION

The present invention is directed to solve the problems pointed out above, and its object is to provide an A/D converter which ensures that the A/D conversion can be performed with the least error even if low-order bits in the converted ten bits are rounded off.

According to one aspect of the present invention, there is provided an A/D converter for converting analog voltage into digital values by comparing a target analog voltage with a comparison voltage obtained by dividing a reference voltage, the A/D converter comprising a sequential approximation register (SA register) having a plurality of bits for storing the results of conversion in digits, an incrementor having a smaller number of bits than that of the SA register, the incrementor receiving a portion of the results of conversion in the SA register corresponding to the same number of high-order bits as the bits thereof and the data about at least one low-order bit in the SA register, and incrementing the result of conversion inputted thereto from the SA register on the basis of the data, and a digital/analog converting division for dividing the reference voltage into the comparison voltage on the basis of the results of conversion in the SA register inputted thereto.

Every time the analog voltage is compared with the comparison voltage the result of comparison is stored in the SA register and the incrementor. For example, suppose that there is a case where the SA register has ten bits and the incrementor has eight bits. If the two bits in the second bit from the least significant bit (LSB) is "1", the result of conversion in the incrementor is compensated by adding "1" thereto. Suppose another case where the SA register has ten bits and the incrementor nine bits. If the least significant bit (LSB) is "1", "1" is added to the result of conversion inputted to the incrementor so as to compensate the result of conversion in the incrementor. In this way, the accuracy of the results of conversion in a smaller number of bits than that of the SA register can be enhanced.

Preferably, the incrementor is provided with a full-scale flag. The advantage of having the flag exhibits Then all the results of conversion are "1". In addition, the results of conversion in the incrementor are set to "$FF_H$".

Preferably, the A/D converter according to the present invention is equipped with an AND circuit to which the consecutive two bits from the least significant bit (LSB) in the SA register are inputted. In addition, a selector circuit is provided so as to select the results of conversion of the 2nd bit from the least significant bit (LSB) in the SA register or alternatively the output from the AND circuit. When the consecutive two bits in the low order become "1", the logic of the AND circuit is completed, thereby enabling the selector circuit to select either the output of the AND circuit or the results of conversion of the 2nd bit in the low order in the SA register. In accordance with the results of selection, "1" is added to the result of conversion in the incrementor, thereby minimizing a possible conversion error. Thus the accuracy of the results of conversion of a smaller number of bits than that of the SA register is enhanced.

Preferably, the A/D converter according to the present invention is equipped with a selector circuit which selects the results of conversion of the SA register or alternatively those of the incrementor. Additionally, it is preferred that the A/D converter is equipped with a switching register which stores data whereby either the results of conversion of the SA register or those of the incrementor is alternatively selected in accordance with the number of bits of the results of conversion to be read and inputs the data to the selector circuit. Since either the results of conversion is outputted in accordance with the data in the switching register, the operator has only to input a predetermined address in reading the results of conversion, thereby being saved from the trouble of inputting an address in accordance with an output.

Preferably, the A/D converter according to the present invention is equipped with a byte/word identifying circuit which identifies whether the results of conversion of the SA register and the incrementor are in byte or in word, and selectively outputs the results of conversion either of the SA register or of the incrementor.

Preferably, the A/D converter according to the present invention is equipped with a selector circuit and an identifying circuit, the selector circuit selectively to which the results of conversion of high-order bits in the SA register are inputted, the results of conversion of other bits excluding the high-order bits in the SA register, or the results of conversion in the incrementor, and the identifying circuit identifying which the results of conversion to be read out are represented in high-order bits or low-order bits, and instructing the selector circuit to output the identified result of conversion.

Preferably, the A/D converter according to the present invention is equipped with a selector circuit to which selectively results of conversion of high-order bits in the SA register are inputted, the results of conversion of other bits excluding the high-order bits in the SA register, or the results of conversion in the incrementor, and also equipped with an identifying circuit which identifies which the results of conversion to be read out are represented in high-order bits or low-order bits or in word, and sends the result of identification to the selector circuit, and wherein the selector circuit outputs the results of conversion of the incrementor when the high-order bits are identified, outputs the results of conversion of others than the high-order bits in the SA register when the low-order bits are identified and outputs the results of conversion of all the bits in the SA register when the words are identified. In this way it is possible to selectively read the result of conversion alternatively.

Preferably, the A/D converter according to the present invention is equipped with a switching register for storing data whereby the results of conversion in the SA register or in the incrementor is alternatively selected depending upon the number of bits of the results of conversion to be read out, and also equipped with a selector circuit to which the results of conversion in the SA register and the incrementor are inputted, the selector circuit selecting the results of conversion either in the SA register or in the incrementor on the basis of the data from the switching register; wherein the digital/analog converting division receives data from the switching register and divides the reference voltage into the comparison voltage on the basis of the results of conversion in the SA register inputted thereto. When the result of conversion of the incrementor is selected in accordance with the data from the switching register, the (1/2) LSB compensation by the D/A converting division is stopped, thereby recuring an accurate conversion of a smaller number of bits than that of the SA register.

Additionally, it is preferred that the data in the switching register is inputted to the SA register. When the results of conversion of the incrementor is selected on the basis of the data from the switching register, the A/D conversion is stopped when a number of A/D conversions are finished corresponding to that of bits, by which the results of conversion in the SA register are inputted to the incrementor. In this way the accuracy of the results of conversion of a smaller number of bits than that in the SA register is enhanced. The setting of a terminating flag or the occurrence of an interrupt produces the same effect.

Preferably, the A/D converter according to the present invention is equipped with a plurality of input terminals to which the analog voltage is inputted, a selector circuit for alternatively selecting the results of conversion either in the SA register or in the incrementor and a plurality of switching registers each for storing data for controlling the selector circuit. The A/D converter includes the same number of the switching register as that of the plurality of input terminals.

The analog voltage applied to one of the plurality of input terminals is selected, and the selected analog voltage is compared with a comparison voltage, and every time the comparison is finished, the results of comparison are stored in the SA register and the incrementor. The result of conversion of the incrementor is compensated on the basis of the result of conversion of at least one bit in the SA register, thereby minimizing a possible error involved in the A/D conversion. The switching register controls the selector circuit in correspondence to the selected terminal to which the analog voltage is applied.

The above and further objects and features of the invention will more fully be apparent from the following detailed description with the accompanying drawings.

Figure 17:
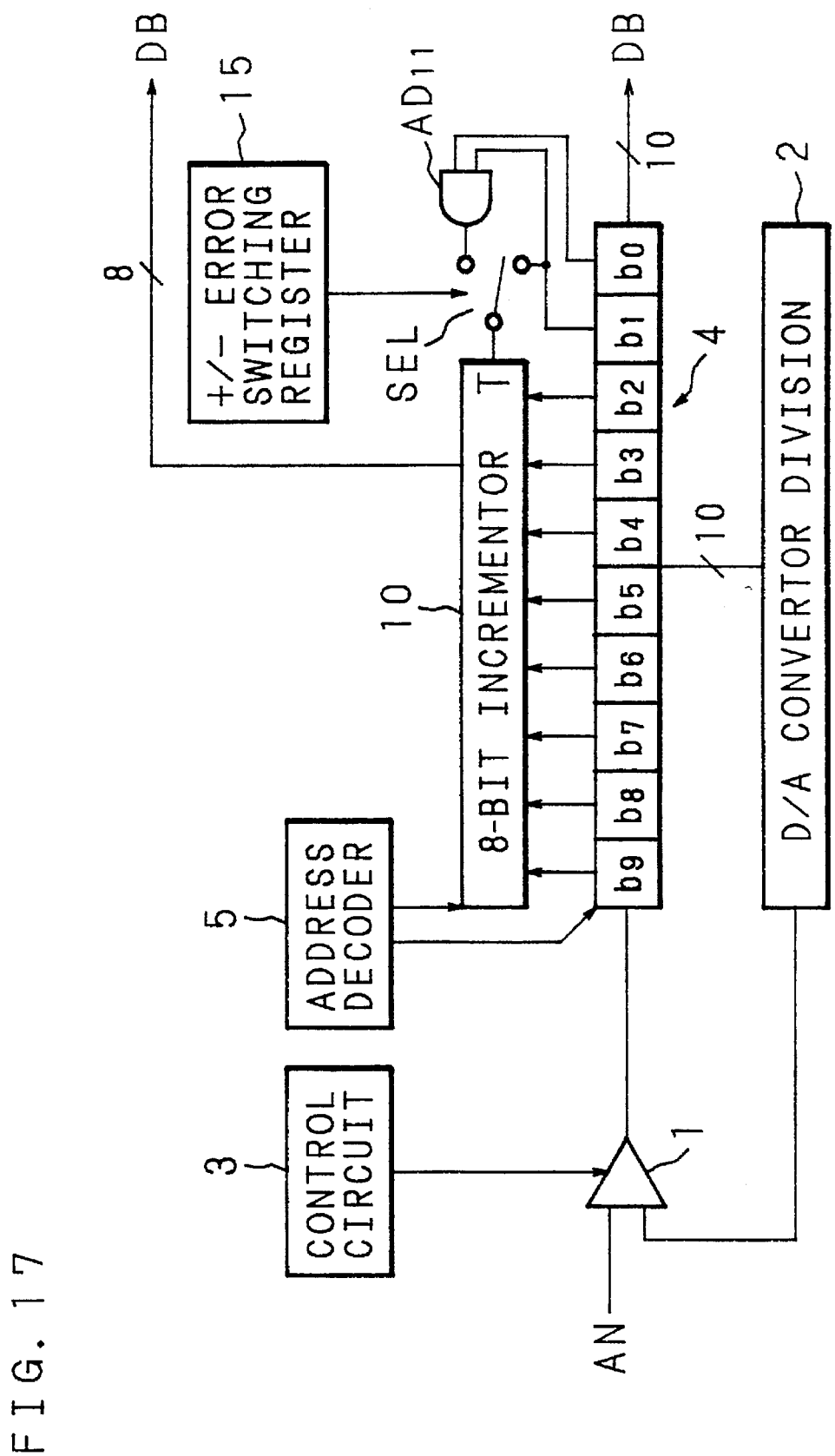
Figure 18:
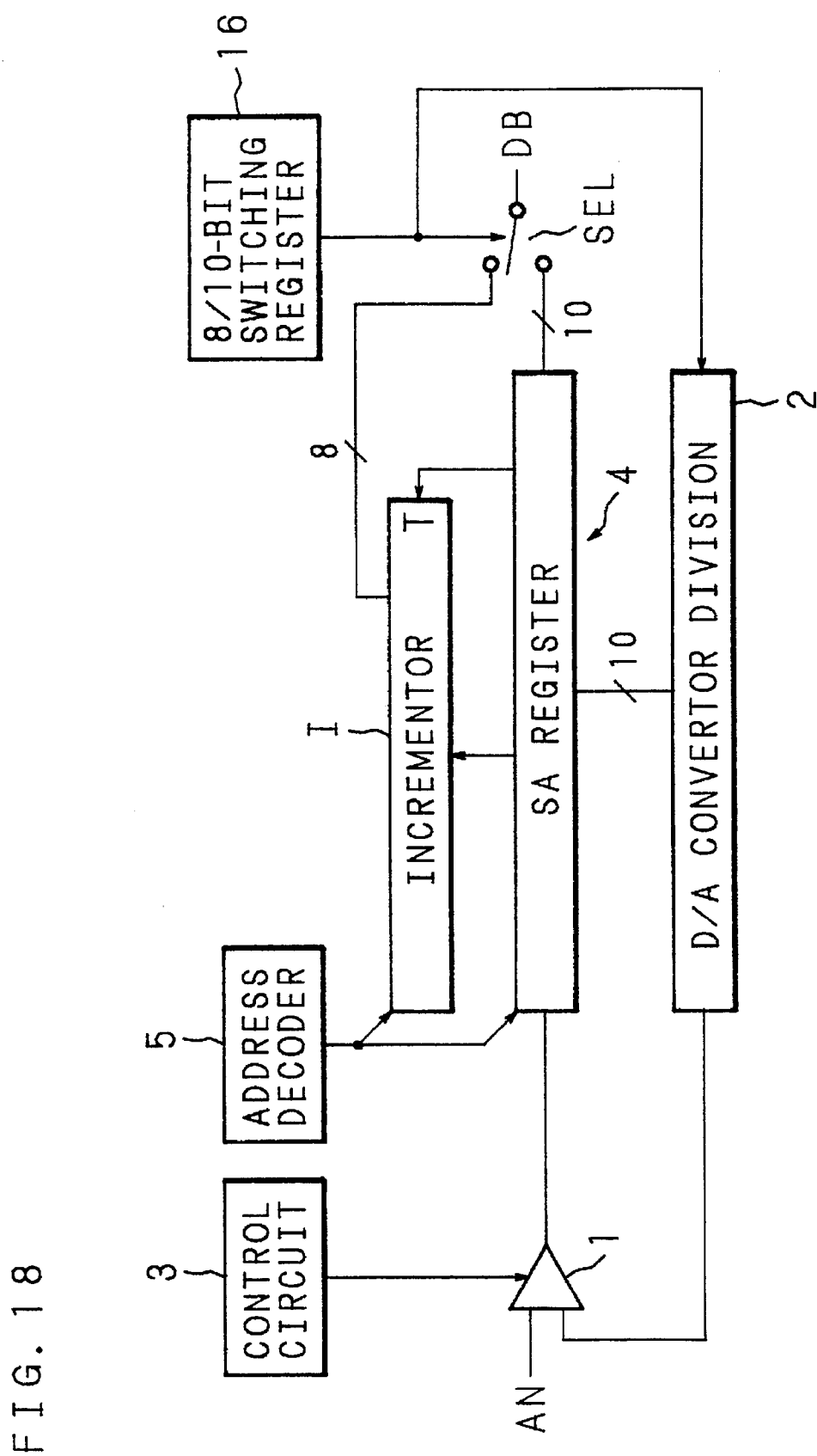
Figure 19:
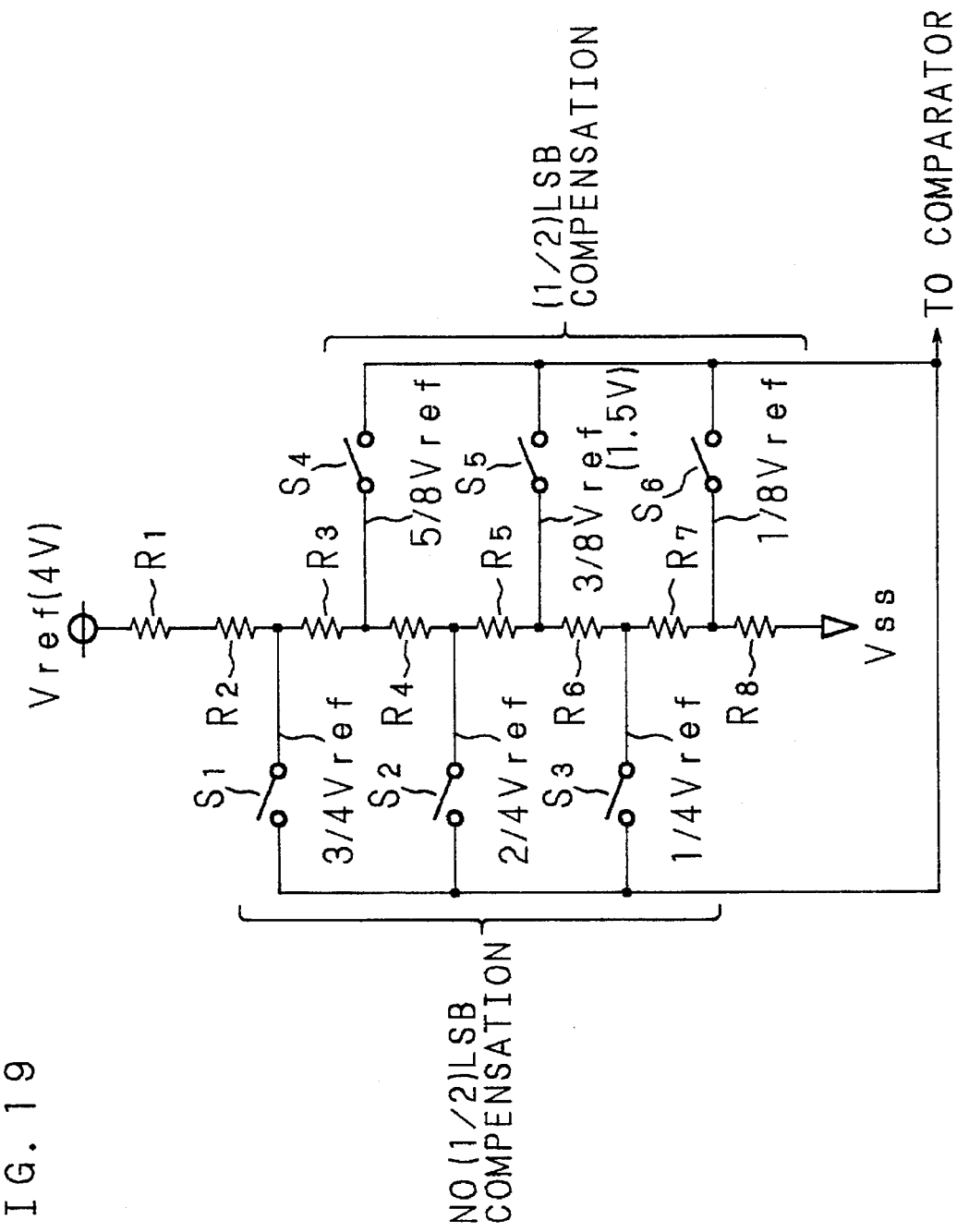
Figure 20:
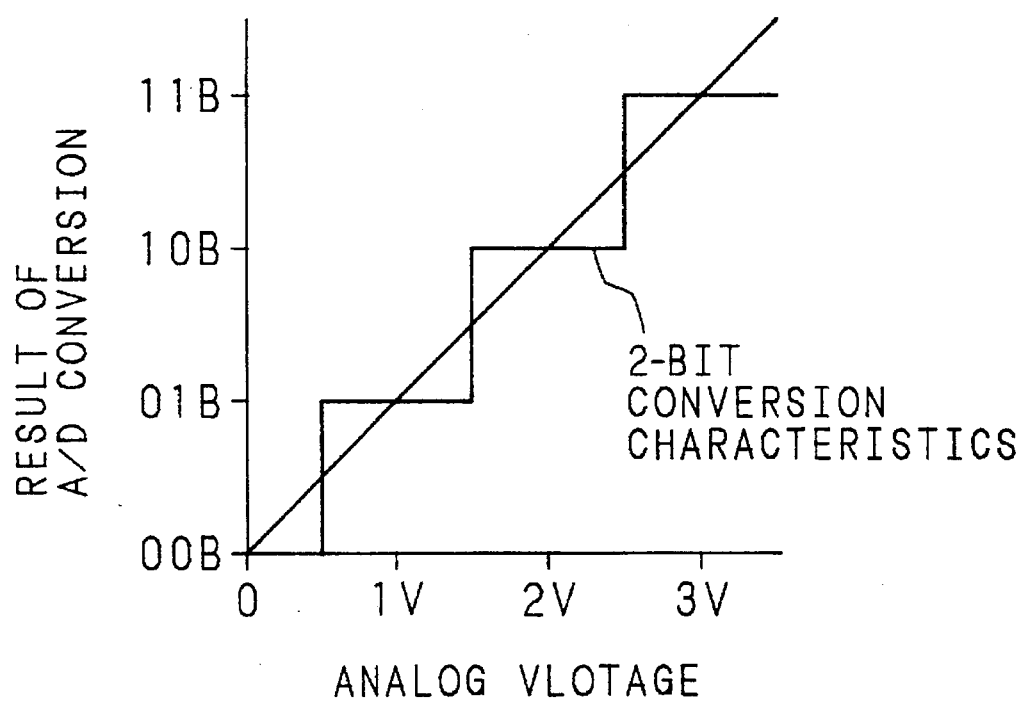
Figure 21:
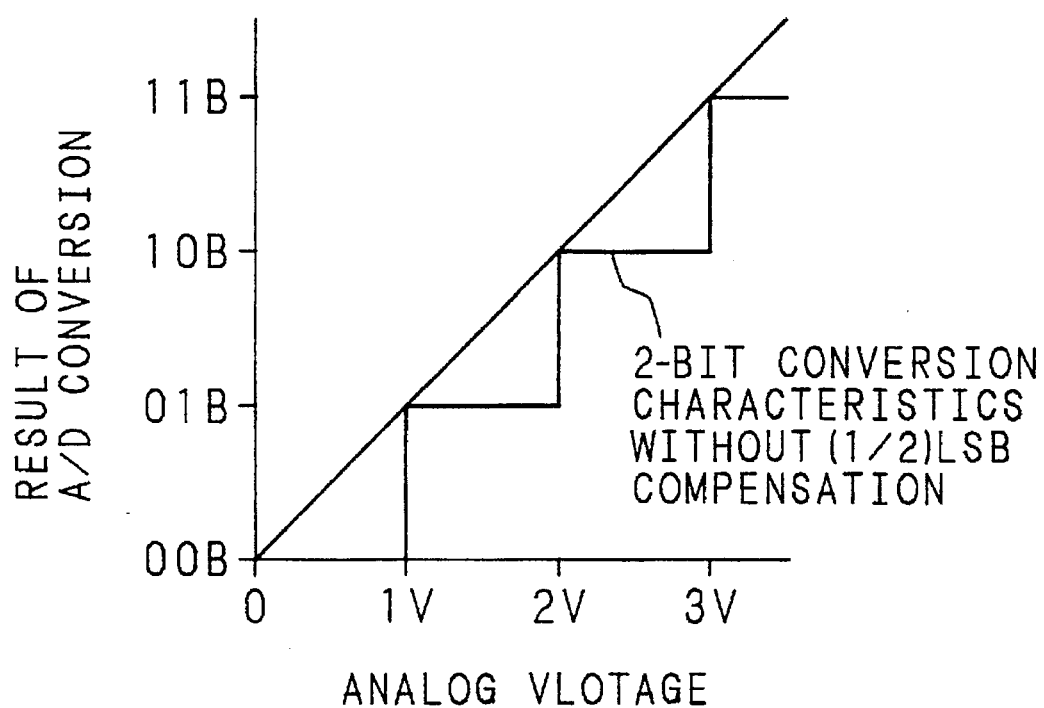
Figure 22:
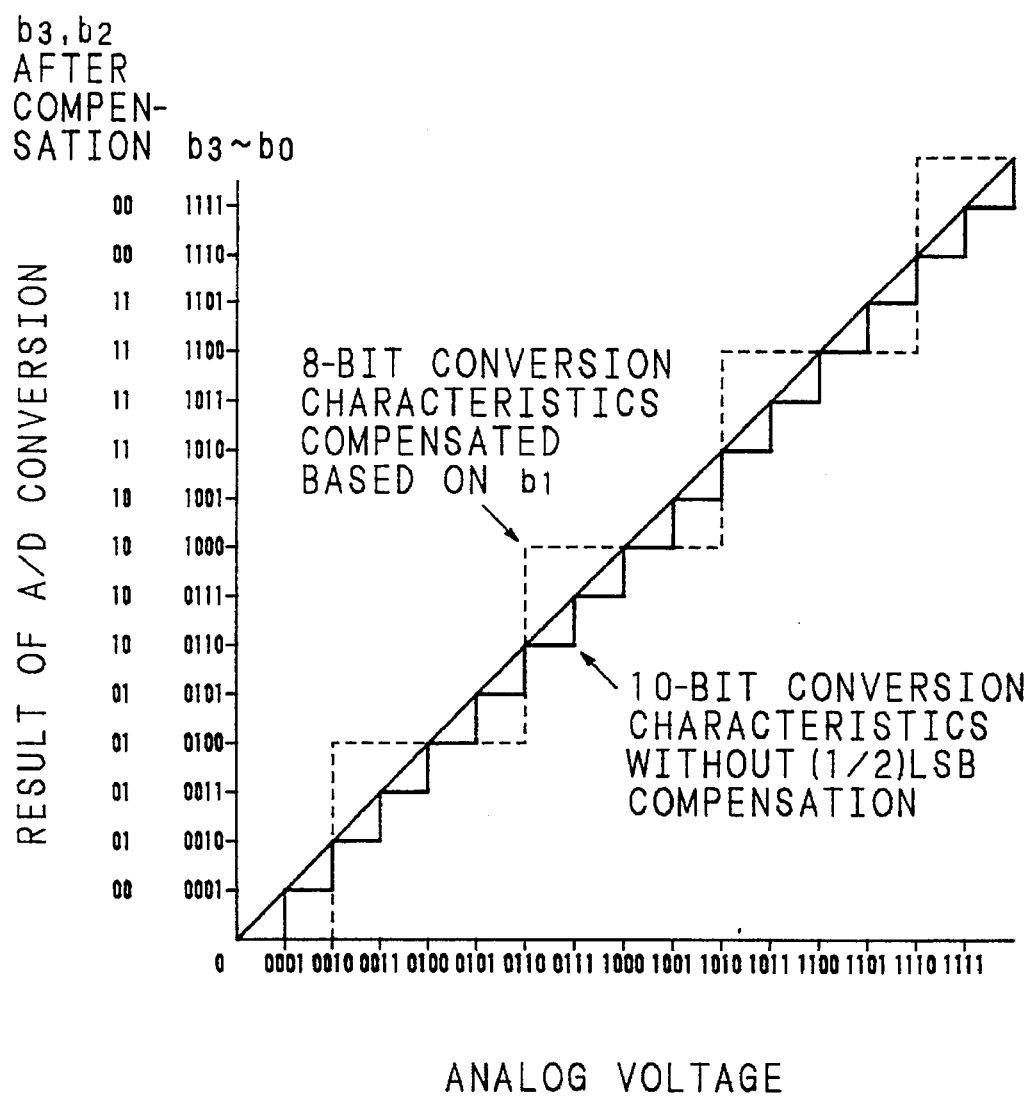
Figure 23:
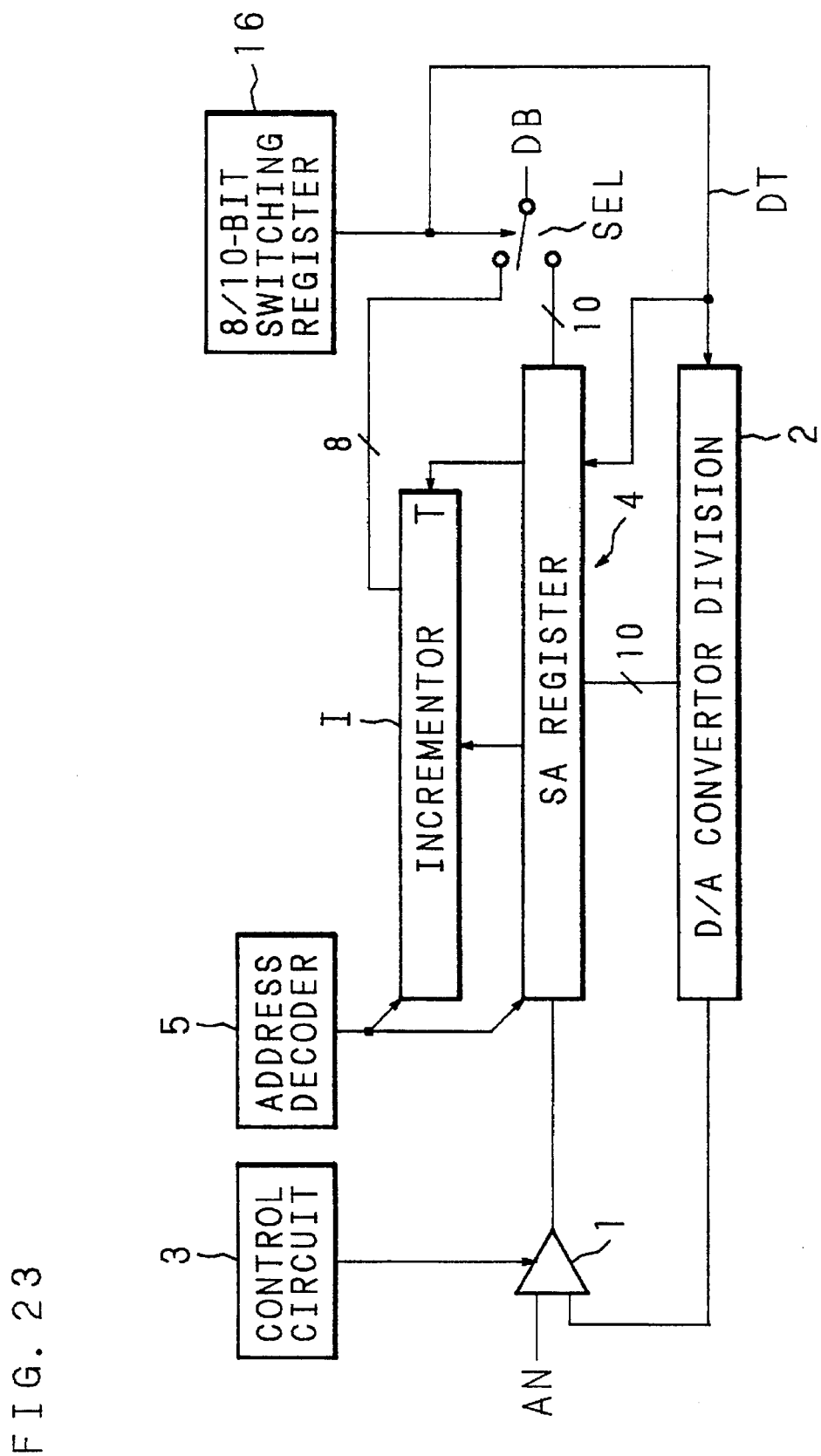
Figure 24:
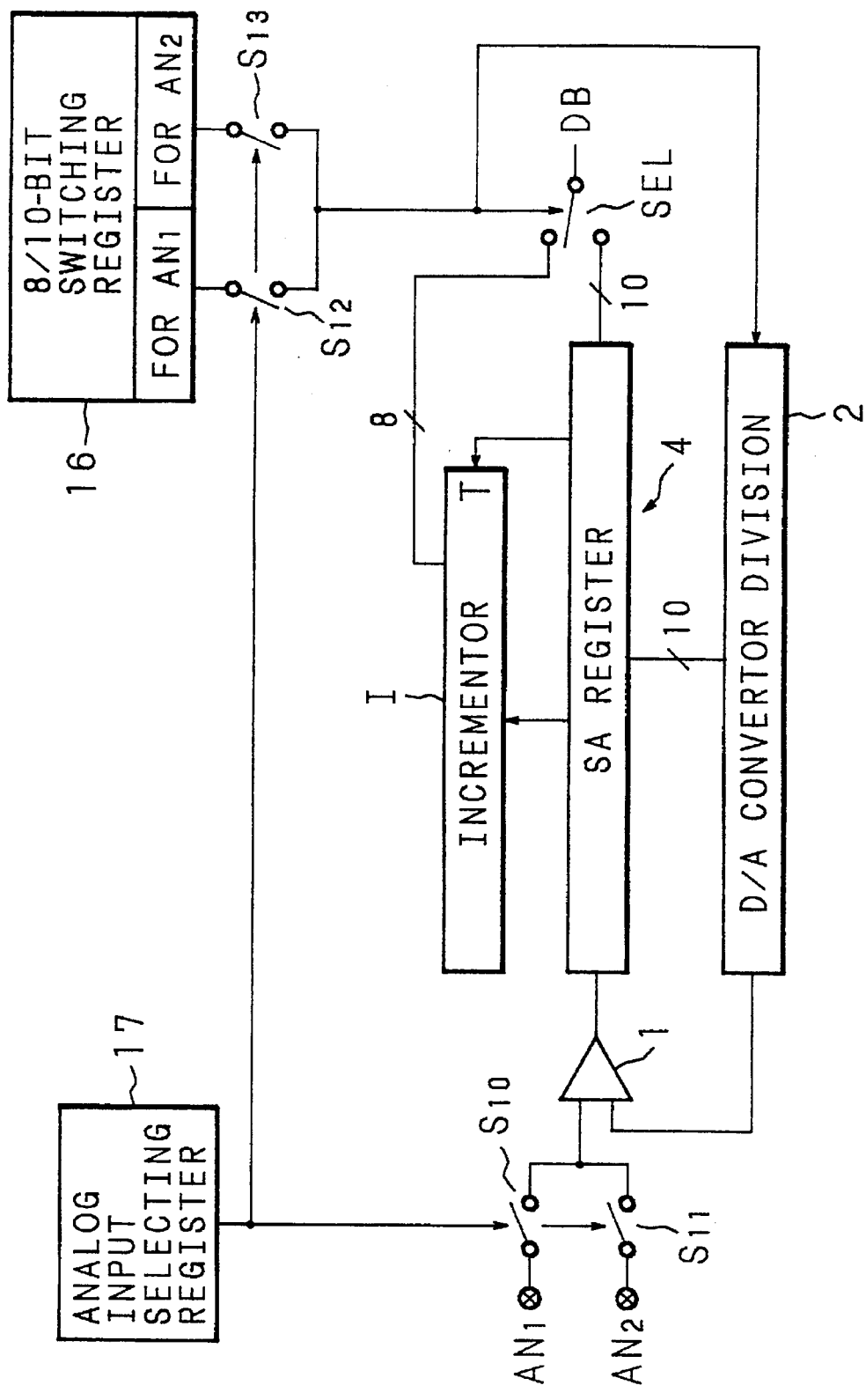

PIG. 16 is a block diagram showing a sixth example of the A/D converter embodying the present invention;

FIG. 17 is a block diagram showing a seventh example of the A/D converter embodying the present invention;

FIG. 18 is a block diagram showing an eighth example of the A/D converter embodying the present invention;

FIG. 19 is a circuit diagram showing a ladder resistor circuit used in an ordinary D/A converting division for 2-bit use;

FIG. 20 is a characteristic graph obtained when (1/2) LSB compensation is effected by an ordinary 2-bit A/D converter;

FIG. 21 is a characteristic graph obtained when no (1/2) LSB compensation is effected by an ordinary 2-bit A/D converter;

FIG. 22 is a characteristic graph obtained when the (1/2) LSB compensation of FIG. 18 is not practiced;

FIG. 23 is a block diagram showing a ninth example of the A/D converter embodying the present invention; and FIG. 24 is a block diagram showing a tenth example of the A/D converter embodying the present invention.

DETAILED DESCRIPTION OF THE PREFERRED EMBODIMENTS

The present invention will now be described referring to the accompanying drawings.

EXAMPLE 1

Figure 4:
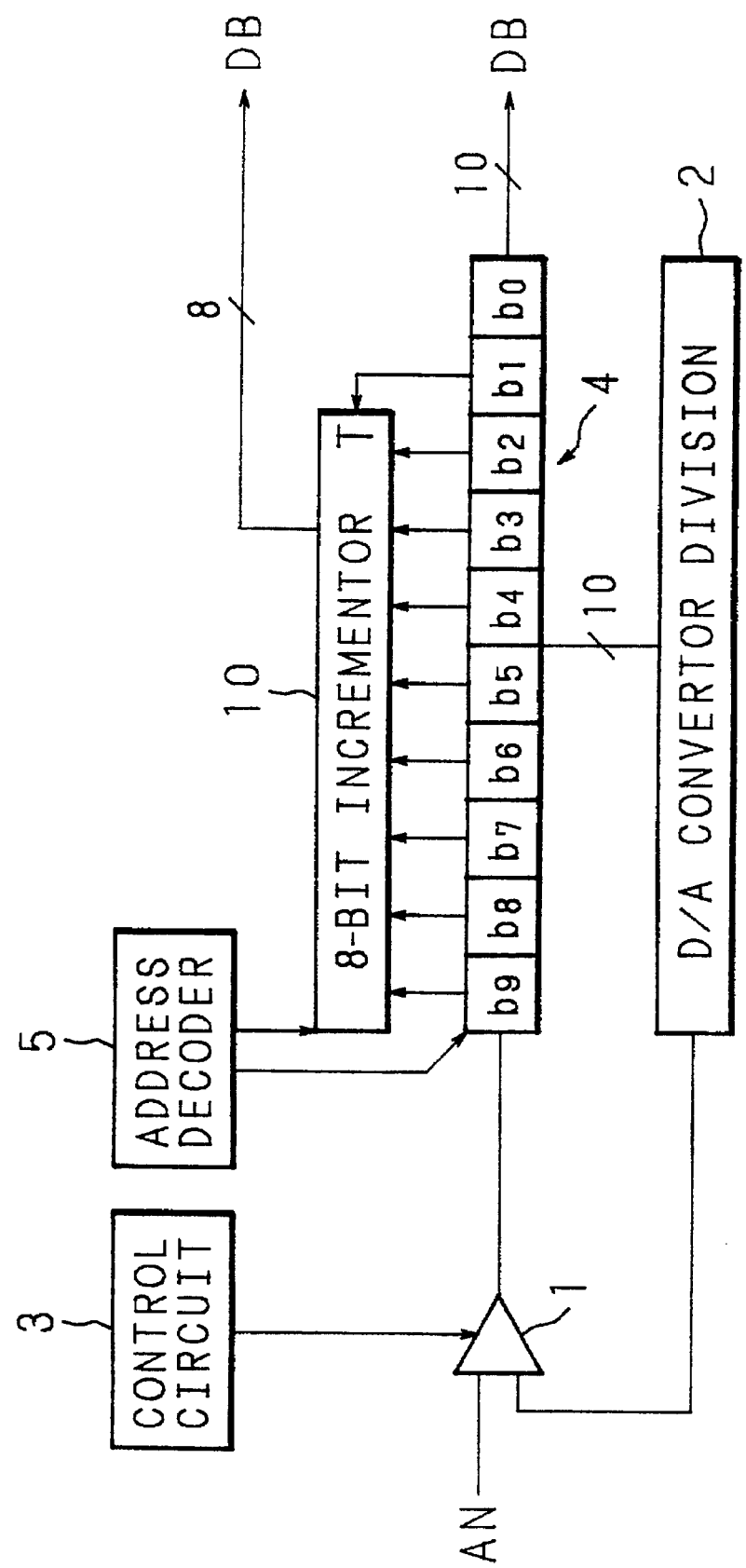
FIG. 4 is a block diagram showing a first example of the A/D converter embodying the present invention.

Referring to FIG. 4, an analog voltage AN to be converted is inputted to an input terminal of the comparator 1 and a reference voltage is inputted to the other input terminal thereof, wherein the comparison reference voltage comes from the D/A convertor division 2. The D/A convertor division 2 includes a ladder resister. The results of comparison by the comparator 1 is inputted to a sequential approximation SA register 4 (hereinafter referred to as "SA register 4"). In this way, the results of comparison made by the comparator 1 are consecutively inputted to the SA register 4, and the results of the conversion in the SA register 4 are inputted to the D/A convertor division 2.

The results of conversion of the 8-bit in the high order in the sequential approximation SA register 4 are inputted to an 8-bit incrementor 10. The results of conversion of the 2nd-bit $b_1$ in the lower order in the SA register 4 is inputted to a trigger terminal T of the incrementor 10. The results of conversion in the incrementor 10 is outputted to a data bus DS. A control signal generated by a control circuit 3 is inputted to a control terminal of the comparator 1. Addresses outputted by an address decoder 5 that correspond to the incrementor 10, and that correspond to the SA register 4 are inputted to the respective address terminals of the incrementor 10 and the SA register 4.

Figure 5:
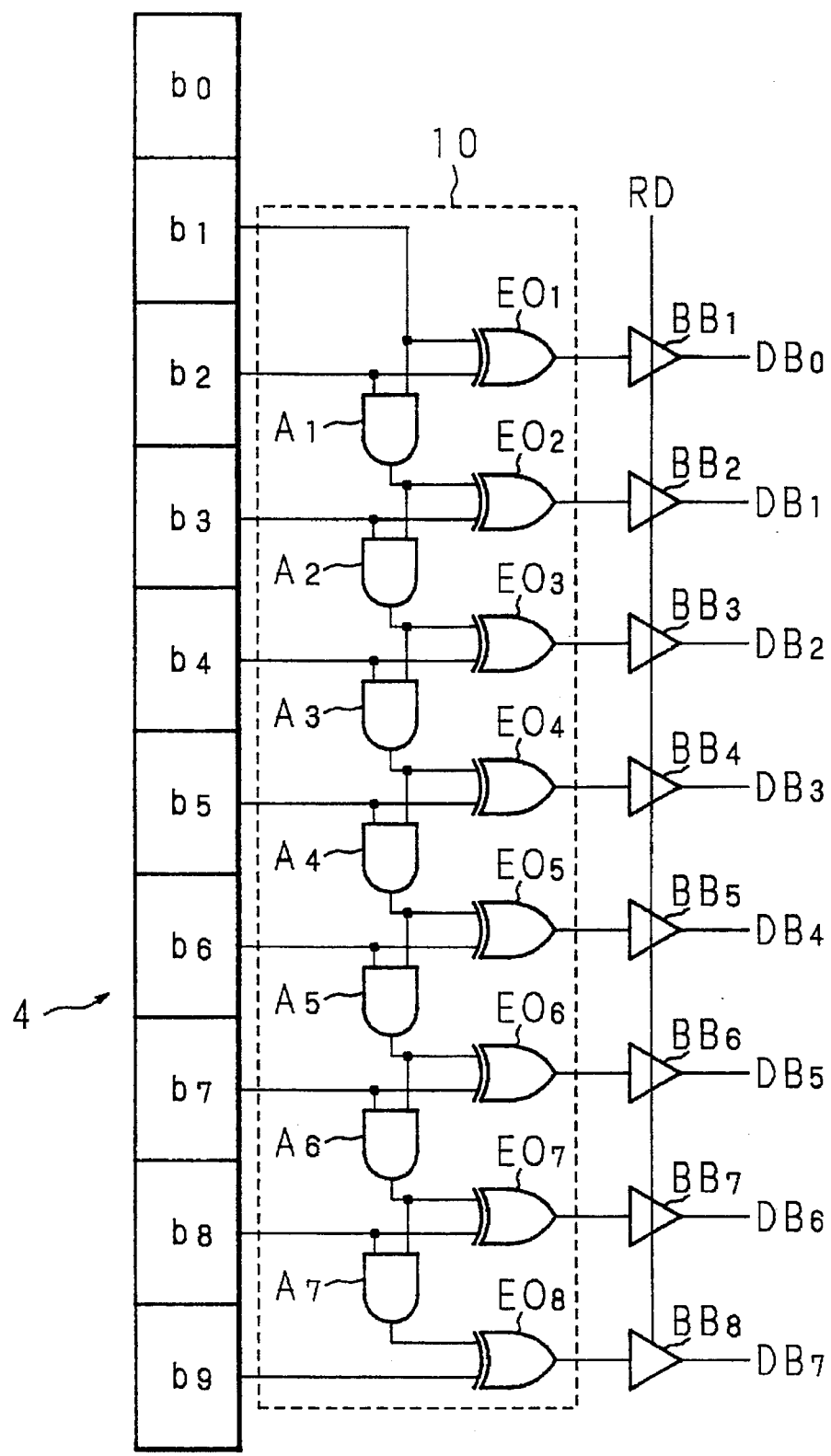
FIG. 5 is a block diagram showing the structure of the 8-bit incrementor shown in FIG. 4.

FIG. 5 indicates the SA register 4 and the incrementor 10. The incrementor 10 includes seven AND circuits and eight EXOR circuits. The 2nd-bit $b_1$ in the SA register 4 is converted and its result is inputted to one of the input terminals of the EXOR circuit $EO_1$ and AND circuit $A_1$. The result of the 3rd-bit $b_2$ conversion is inputted to the other input terminals thereof. The output of the AND circuit $A_1$ is inputted to one of the input terminals of each of the subsequent EXOR circuit $EO_2$ and AND circuit $A_2$, and the result of the 4th-bit $b_3$ conversion is inputted to the other input terminals thereof.

The output of the AND circuit $A_2$ is inputted to one of the input terminals of the subsequent EXOR circuit $EO_3$ and AND circuit $A_3$, and the result of the 5th-bit $b_4$ conversion is inputted to the other input terminals thereof. The output of the AND circuit $A_3$ is inputted to one of the input terminals of the EXOR circuit $EO_4$ and AND circuit $A_4$, and the 6th-bit $b_5$ conversion is inputted to the other input terminals thereof.

The output of the AND circuit $A_4$ is inputted to one of the input terminals of the EXOR circuit $EO_5$ and AND circuit $A_5$, and the result of the 7th-bit $b_6$ conversion is inputted to the other input terminals thereof. The output of the AND circuit $A_5$ is inputted to one of the input terminals of the EXOR circuit $EO_6$ and AND circuit $A_6$, and the result of the 8th-bit $b_7$ conversion is inputted to the other input terminals thereof. The output of the AND circuit $A_6$ is inputted to one of the input terminals of the EXOR $EO_7$ and AND circuit $A_7$, and the result of 9th-bit $b_8$ conversion is inputted to the other input terminal thereof. The output of the AND circuit $A_7$ is inputted to one of the input terminals of the EXOR $EO_8$, and the result of 10th-bit $b_9$ conversion is inputted to the other terminal thereof. The outputs of the EXOR circuits $EO_1$, $EO_2$, $EO_3$, $EO_4$, $EO_5$, $EO_6$, $EO_7$, $EO_8$, and $EO_9$ are outputted to the data buses $DB_0$, $DB_1$, $DB_2$, $DB_3$, $DB_4$, $DB_5$, $DB_6$, and $DB_7$ through bus buffers $BB_1$, $BB_2$, $BB_3$, $BB_4$, $BB_5$, $BB_6$, $BB_7$, and $BB_8$. A common reading signal RD is inputted to each of the bus buffers $BB_1$, $BB_2$, $BB_3$, $BB_4$, $BB_5$, $BB_6$, and $BB_7$.

The A/D converter is operated as follows:

The operation of the A/D converter is started in response to the control signal outputted through the control circuit 3 which instructs A/D conversion. First, "1" is set at the MSB ($b_9$) in the SA register 4 whereby the D/A convertor division 2 outputs a comparison voltage $(1/2)V_{ref}$ so as to enable the comparator 1 to compare the analog voltage AN to be converted with the comparison voltage $(1/2)V_{ref}$. If the comparison finds that the analog voltage AN is smaller than the comparison voltage $(1/2)V_{ref}$, the MSB ($b_9$) is reset. If it finds that the analog voltage AN is larger than the comparison voltage $(1/2)V_{ref}$, the MSB ($b_9$) is kept in its set state.

Then, "1" is set at the high-order 2nd-bit $b_8$ in the SA register 4 where if the MSB($b_9$) is set to "1" the D/A convertor division 2 outputs a comparison voltage $(3/4)V_{ref}$ and if it is not set to "1", it outputs a comparison voltage $(1/4)V_{ref}$ whereby the comparator 1 makes a second comparison between the analog voltage AN and the comparison voltage $(1/4)V_{ref}$. If the comparison finds that the analog voltage AN is smaller than the comparison voltage $(1/2)V_{ref}$, the 2nd-bit$_8$ is reset. If it finds that the analog voltage AN is larger than the comparison voltage $(1/2)V_{ref}$, the 2nd-bit$_8$ is kept in its set state. In the case of the 10-bit A/D conversion, the same procedure mentioned above is repeated 10 times until the ultimate A/D conversion is finished. In this way the A/D conversion is finished. At this stage, if "1" is set at the low-order 2nd-bit $b_1$ in the SA register 4, the incrementor 10 is operated to add "1" to the results of conversion of eight bits, that is, from the 3rd-bit $b_2$ to the 10th-bit $b_9$. The results of conversion by the incrementor 10 are shown in TABLE 1:

TABLE 1

| CONTENT OF SA REGISTER | | | CONTENT OF INCREMENTOR | |
|---|---|---|---|---|
| 0 0 0 0 | 0 0 0 0 | 0 0 | 0 0 0 0 | 0 0 0 0 |
| 0 0 0 0 | 0 0 0 0 | 0 1 | 0 0 0 0 | 0 0 0 0 |
| 0 0 0 0 | 0 0 0 0 | 1 0 | 0 0 0 0 | 0 0 0 1 |
| 0 0 0 0 | 0 0 0 0 | 1 1 | 0 0 0 0 | 0 0 0 1 |
| ‖ | ‖ | ‖ | ‖ | ‖ |
| 0 0 0 0 | 1 1 1 1 | 1 0 | 0 0 0 1 | 0 0 0 0 |
| ‖ | ‖ | ‖ | ‖ | ‖ |
| 1 1 1 1 | 1 1 1 1 | 0 1 | 1 1 1 1 | 1 1 1 1 |
| 1 1 1 1 | 1 1 1 1 | 1 0 | 0 0 0 0 | 0 0 0 0 |
| 1 1 1 1 | 1 1 1 1 | 1 1 | 0 0 0 0 | 0 0 0 0 |
| $b_9$–$b_6$ | $b_5$–$b_2$ | $b_1$–$b_0$ | RESULTS OF CONVERSION IN INCREMENTOR, ADDED "1" TO RESULTS OF CONVERSION FROM 3RD-BIT $b_2$ TO 10TH-BIT $b_9$ | |

Figure 6:
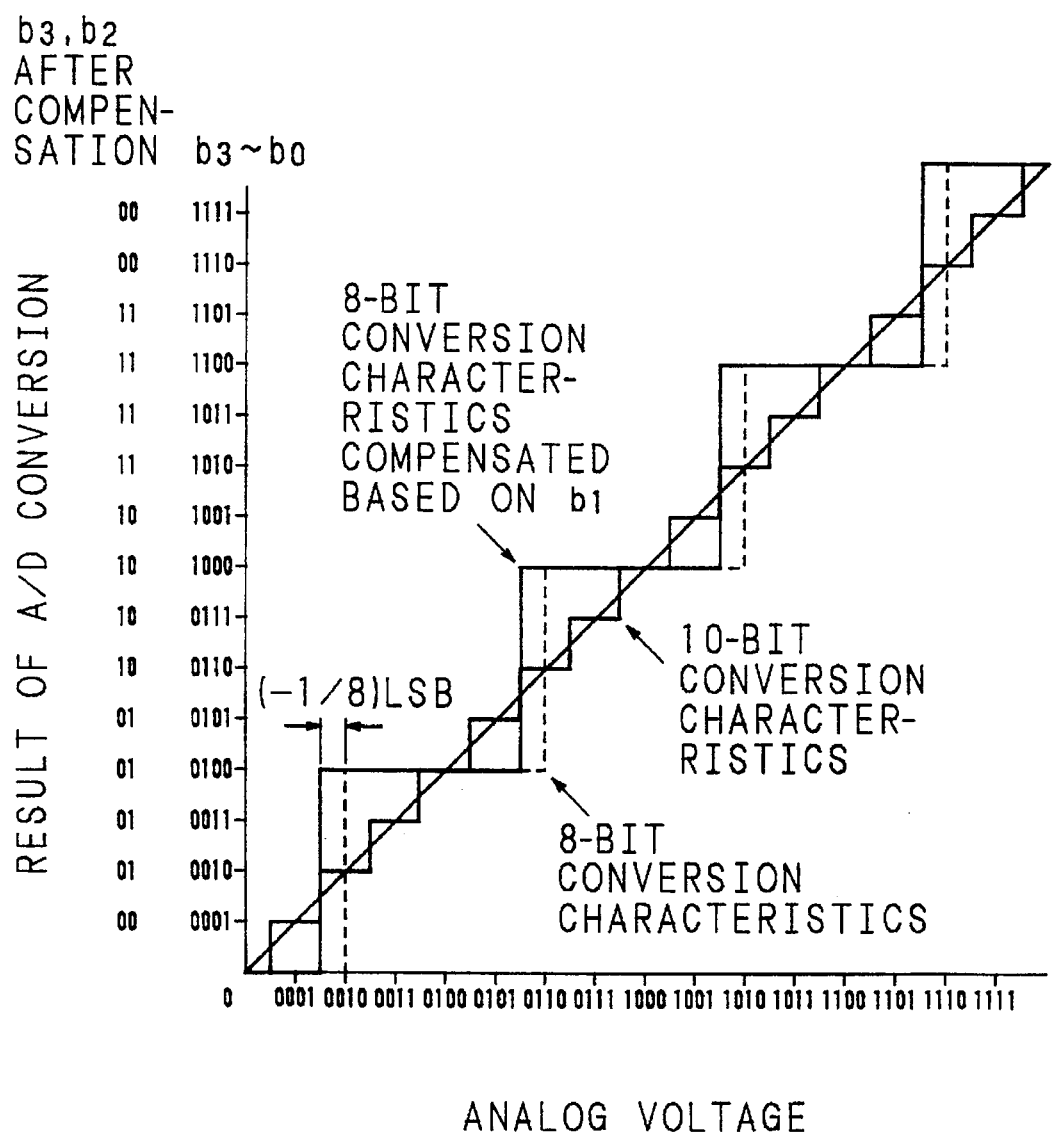
FIG. 6 is a characteristic graph showing the A/D conversion performed by the first example.

The characteristics of conversion of eight bits resulting from the addition effected by the incrementor 10 are shown in FIG. 6 where the X-axis indicates an analog voltage and the Y-axis indicates the results of the A/D conversion. The thick full lines indicate the conversion characteristics of eight bits achieved through the compensation of the "1" addition by the incrementor 10. It will be appreciated from FIG. 6 that the compensated characteristics approximate to the ideal characteristics of eight bits conversion shown in dotted lines.

Figure 1:
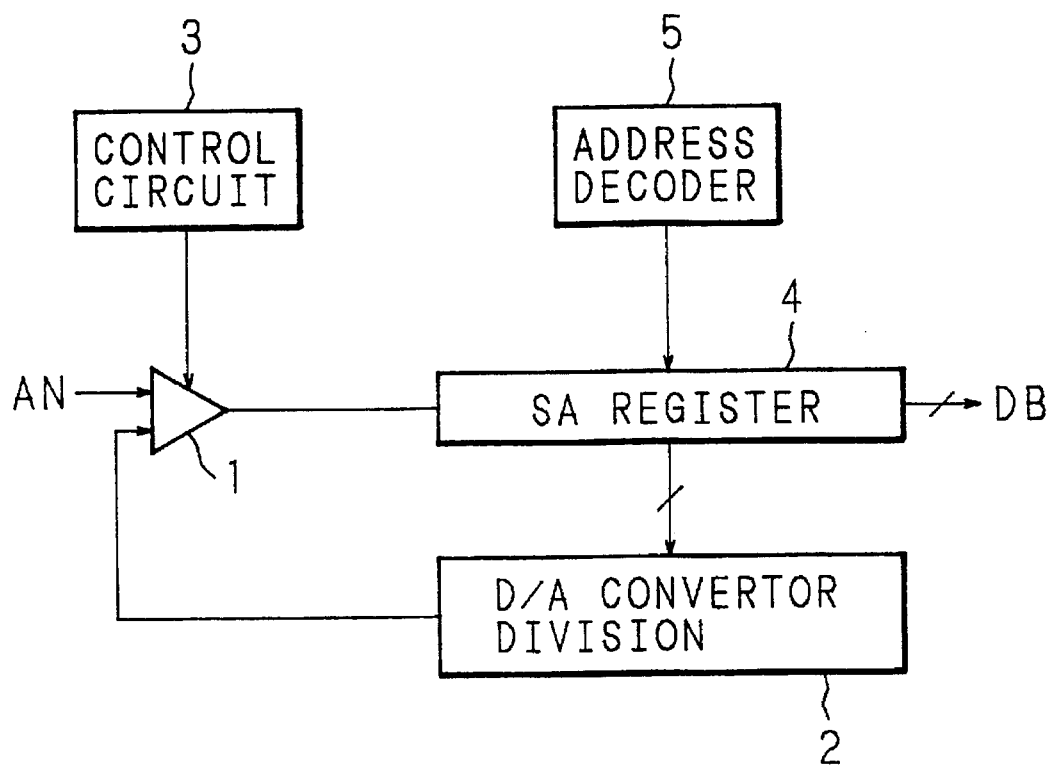
FIG. 1 is a block diagram showing a conventional sequential comparison type A/D converter.
Figure 2:
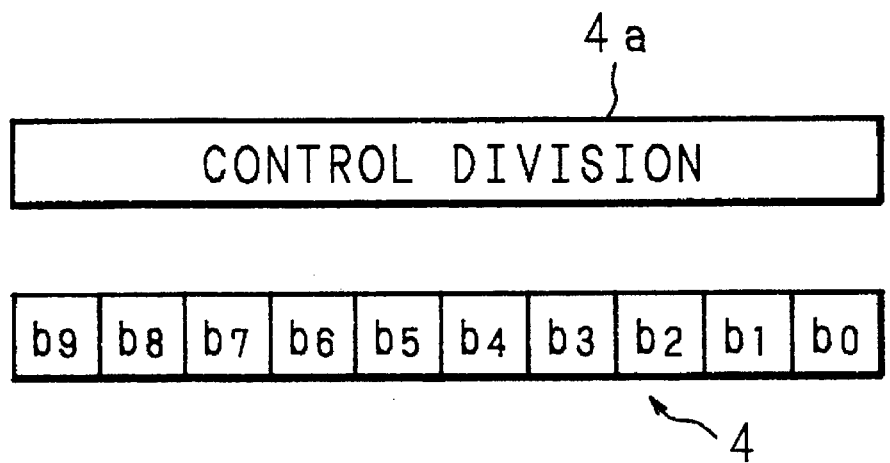
FIG. 2 is a diagrammatic view showing the structure of a conventional sequential approximation register.
Figure 3:
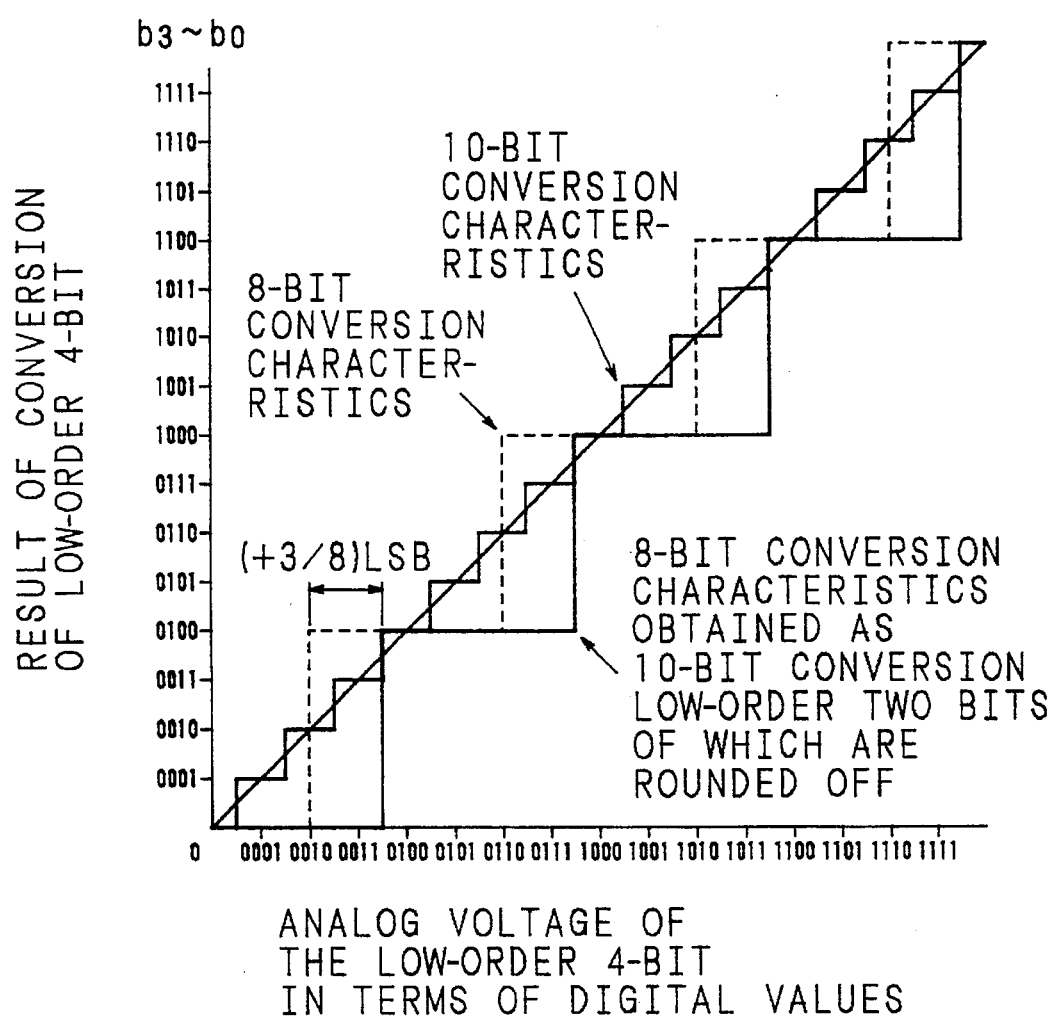
FIG. 3 is a characteristic graph showing the A/D conversion performed by a conventional A/D converter.

In the known A/D convertors an error occurring the conversion was in the range of +(3/8)LSB (FIG. 3) but in the A/D convertor according to the present invention it is reduced to −(1/8)LSB. This is achieved by adding small increments to the results of the conversion by the incrementor 10. In this way the accuracy of (1/4) LSB is enhanced as compared with the known A/D convertors.

Figure 7:
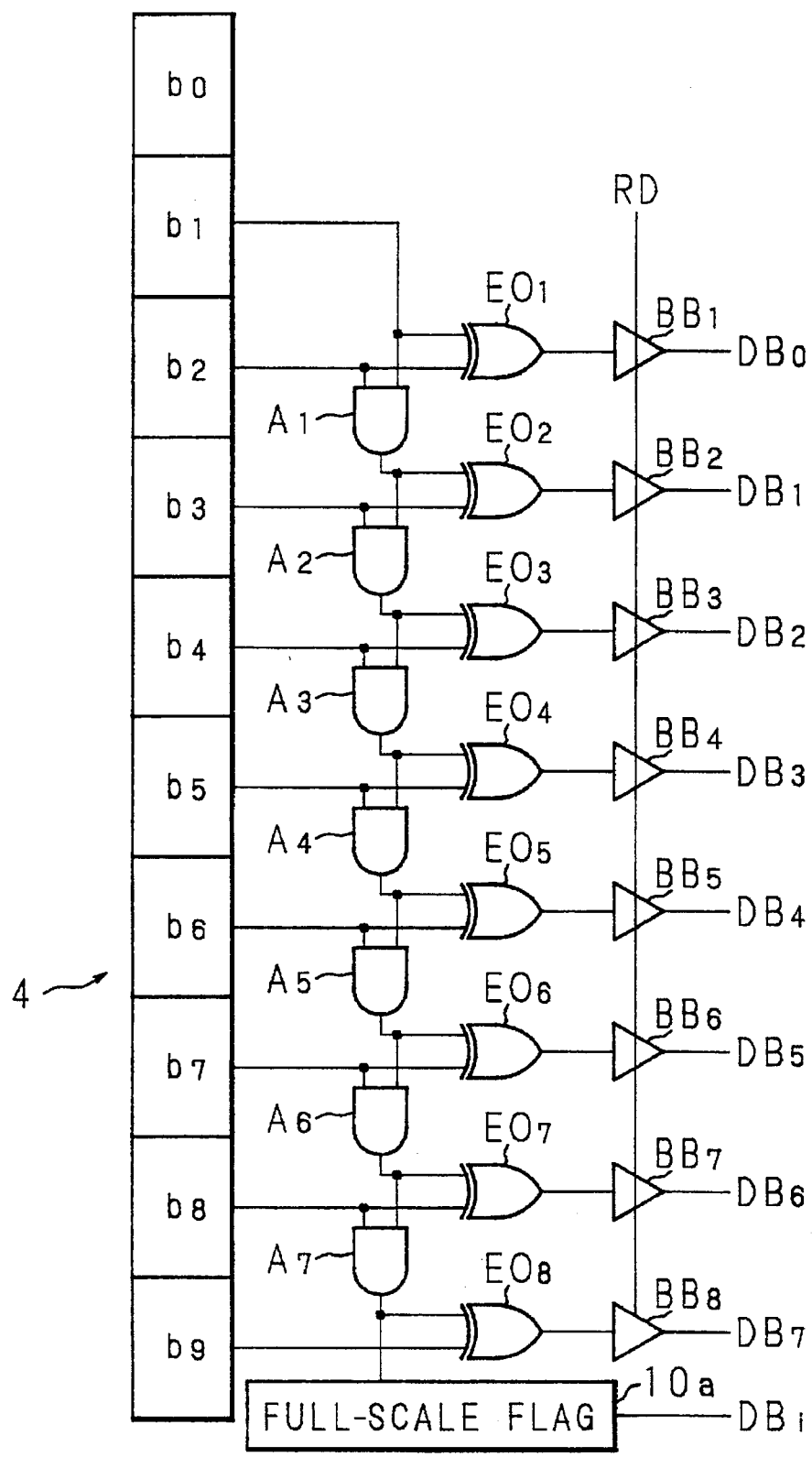
FIG. 7 is a block diagram showing another example of the 8-bit incrementor.

Referring to FIG. 7, wherein like reference numerals designate like elements and components to those in FIG. 5, another example of the incrementor 10 will be described:

The output of AND circuit $A_7$ is inputted to a full-scale flag 10a whose contents are outputted to a data bus $DB_i$, The other structure is the same as that shown in FIG. 5. In the incrementor 10, when all the bits $b_9$ to $b_1$ in the high order are "1", "1" is set at the full-scale flag 10a. By reading both the content of the incrementor 10 and the content of the full-scale flag 10a, it is possible to distinguish between when the content of the incrementor 10 is "$00_H$" and when it is "$FF_H$".

Figure 8:
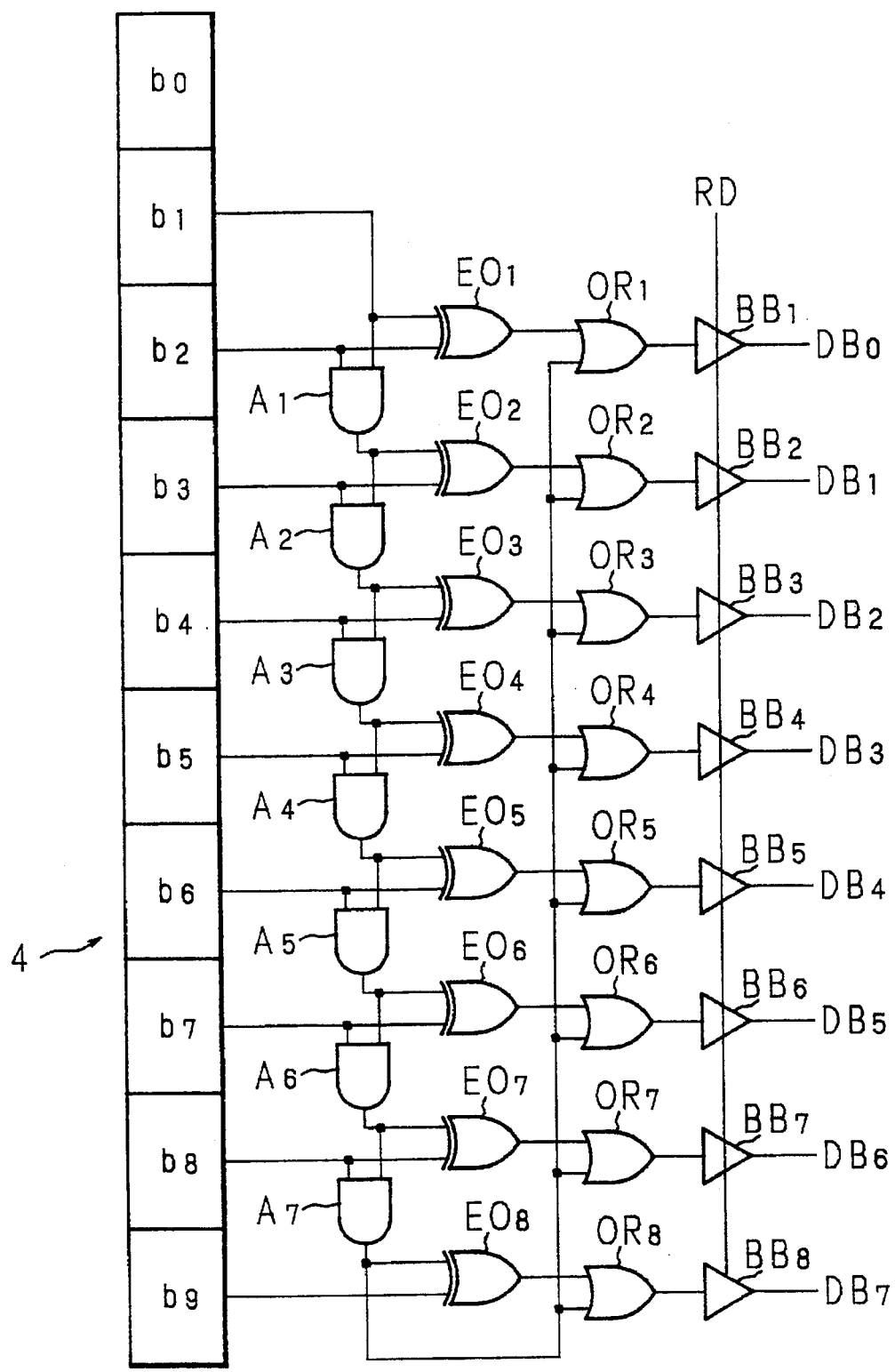
FIG. 8 is a block diagram showing a further example of the 8-bit incrementor.

FIG. 8 shows a further example of the incrementor 10, wherein like reference numerals designate like elements and components to those in FIG. 5. The output of each of the EXOR circuits $EO_1$ to $EO_8$ is inputted to an input terminal of OR circuits $OR_1$ to $OR_8$, respectively. The output of AND circuit $A_7$ is inputted in common to their other input terminals of the OR circuits $OR_1$ to $OR_8$. The outputs of the OR circuits $OR_1$ to $OR_8$ are inputted to bus buffers $BB_1$ to $BB_8$, respectively.

In the incrementor 10 shown in FIG. 8, when the content of the incrementor is "$FF_H$" or more, it can be fixed to "$FF_H$".

The incrementors described above are examples and they can be variously modified without departing from the spirit of the present invention. It is possible to combine the examples shown in FIGS. 7 and 8 so that when the content of the incrementor 10 exceeds "$FF_H$," it can be fixed to "$FF_H$" and the exceeding over the full scales can be indicated by a flag. In the EXAMPLE 1 the sequential approximation register and the incrementor are mutually independent, but it is possible to incorporate the incrementor into the sequential approximation register into an integer, thereby reducing the size of the circuit.

As shown in FIG. 5, it is common to output the content of the incrementor 10 to the data bus through the buffer.

EXAMPLE 2

Figure 9:
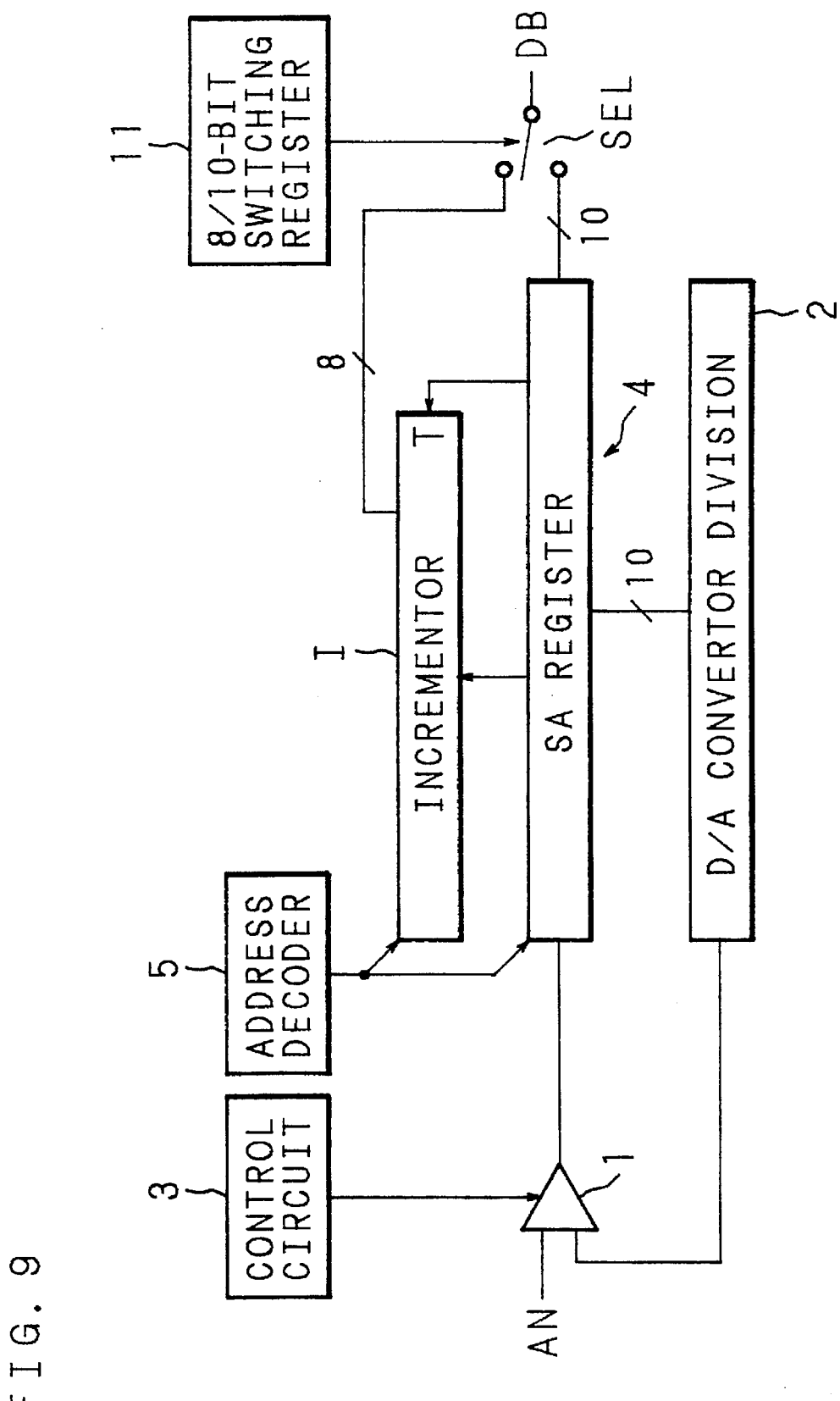
FIG. 9 is a block diagram showing a second example of the A/D converter embodying the present invention.

Referring to FIG. 9, wherein like reference numerals designate like elements and components to those in FIG. 4, an incrementor I has the same structure as that of the incrementor 10 in EXAMPLE 1. The results of conversion of 2nd bits in the low-order in the SA register 4 are inputted to a trigger terminal T of the incrementor I. The same addresses from an address decoder 5 are inputted to the 8-bit incrementor I and the SA register 4. Each output of the incrementor I and the SA register 4 is outputted to a data bus DB through a selector circuit SEL which can select either of them. The selector circuit SEL receives data from an 8/10-bit switching register 11. Either results of 8-bit or 10-bit conversion are outputted to the data bus DB. The remaining structure is the same as that shown in FIG. 4; the description thereof will be omitted for simplicity.

The MD conversion of this EXAMPLE 2 is operated in the same manner as EXAMPLE 1 shown in FIG. 4.

The same address is inputted to the incrementor I and the SA register 4 so as to enable each of them to output the content of the conversion. For example, a data for selecting an 8-bit conversion is inputted to the selector circuit SEL through the 8/10-bit switching register 11, the 8-bit data incrementor I is selected and inputted to the data bus DB. If a data for selecting a 10-bit conversion is inputted to the selector circuit SEL, the 10-bit conversion in the SA register 4 is selected and inputted to the data bus DB.

In EXAMPLE 2, since the incrementor I and the SA register 4 can be assigned to the same address, the operator does not need to be conscious of the address when a data is read.

EXAMPLE 3

Figure 10:
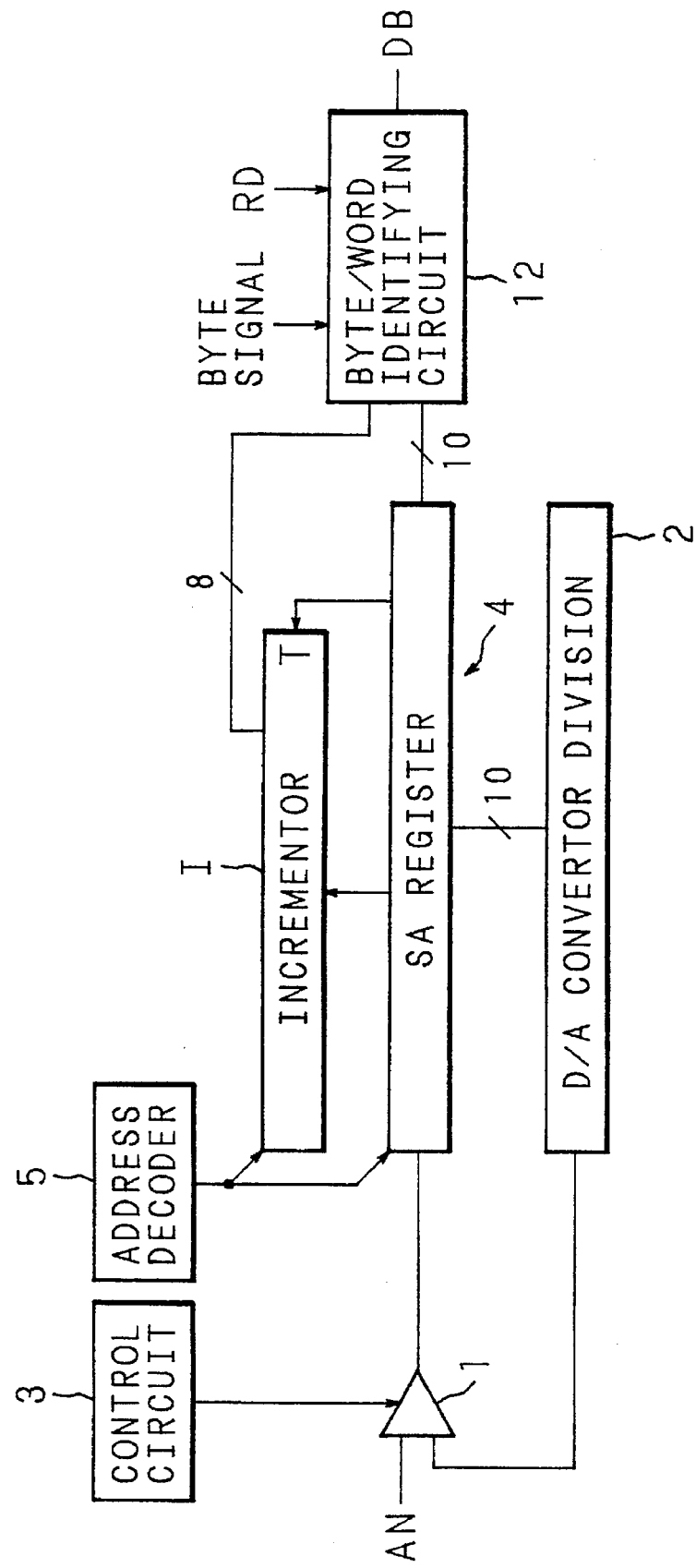
FIG. 10 is a block diagram showing a third example of the A/D converter embodying the present invention.

Referring to FIG. 10, wherein like reference numerals designate like elements and components to those in FIGS. 4 and 9, an incrementor I like the 8-bit incrementor 10 in EXAMPLE 1 is prepared. The results of conversion of 2nd-bit in the low-order in a sequential approximation register 4 ("SA register 4") is inputted to a trigger terminal T of the incrementor I. The contents of conversion in the incrementor I and SA register 4 are inputted to a byte/word identifying circuit 12 the data from which is inputted to a data bus DB. The byte/word identifying circuit 12 receives a byte signal and a read signal RD.

TABLE 2 shows the relationship between a register in a 16-bit CPU in common use and an address signal for accessing an 8-bit register, with respect to an address covering four bytes. The registers are arranged such that eight bits in the low order are arranged in the even addresses and eight bits in the high-order are in arranged in the odd addresses. A0 and A1 indicate two bits in the low order in an address signal. BYTE indicates a byte signal which becomes "1" in response to a byte access, and becomes "0" in to a word access under an instruction provided by the CPU. At this stage an even address and an odd address are simultaneously outputted.

OR circuit 12d is outputted to the data bus DB through a buffer 12e. The buffer 12e receives a read signal RD.

The byte/word identifying circuit 12 is operated as follows:

When the addresses in the low order are outputted byte by byte, the result of conversion of the incrementor I is outputted to the data bus DB. When the addresses are outputted word by word, the results of conversion of the SA register 4 is outputted to the data bus DB. As a result, the operator is released from the necessity of setting data at the registers so as to select each by 8-bits, 10-bits and so on.

EXAMPLE 4

Figure 12:
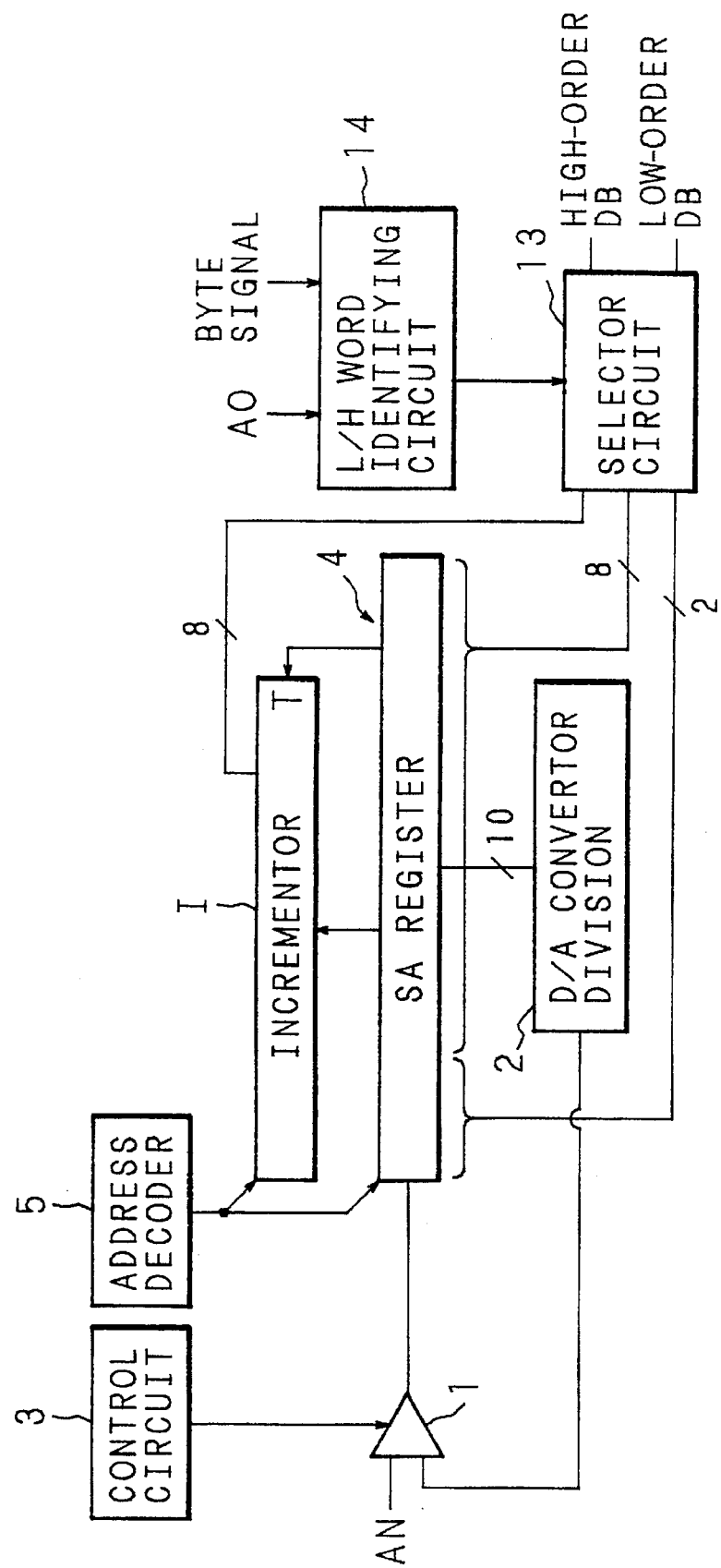
FIG. 12 is a block diagram showing a fourth example of the A/D converter embodying the present invention.

Referring to FIG. 12, wherein like reference numerals designate like elements and components to those in FIG. 4, an 8-bit incrementor I like the 8-bit incrementor 10 of EXAMPLE 1 is prepared. The results of conversion of 2nd bit in the low-order in a sequential approximation register 4 ("SA register 4") is inputted to a trigger terminal T of the incrementor I. The content of conversion in the incrementor I and those of the two bits $b_9$ and $b_8$ in the high order and eight bits $b_7$ to $b_0$ in the low order in the SA register 4 are all inputted to a selector circuit 13. The selector circuit 13 receives the result of identification conducted by an L/H

TABLE 2

| ADDRESS #1 | ADDRESS #0 |
|---|---|
| REGISTER H (HIGH ORDER) (DB15~8) | REGISTER H (LOW ORDER) (DB7~0) |

| ADDRESS #3 | ADDRESS #2 |
|---|---|
| REGISTER H (HIGH ORDER) (DB15~8) | REGISTER H (LOW ORDER) (DB7~0) |

| A1 | A0 | BYTES | |
|---|---|---|---|
| 0 | 0 | 0 | ACCESSING ADDRESS #0 AND ADDRESS #1 WORD BY WORD |
| 0 | 0 | 1 | ACCESSING ADDRESS #0 BYTE BY BYTE |
| 0 | 1 | 0 | ACCESSING ADDRESS #0 AND ADDRESS #1 WORD BY WORD |
| 0 | 1 | 1 | ACCESSING ADDRESS #1 BYTE BY BYTE |
| 1 | 0 | 0 | ACCESSING ADDRESS #2 AND ADDRESS #3 WORD BY WORD |
| 1 | 0 | 1 | ACCESSING ADDRESS #2 BYTE BY BYTE |
| 1 | 1 | 0 | ACCESSING ADDRESS #2 AND ADDRESS #3 WORD BY WORD |
| 1 | 1 | 1 | ACCESSING ADDRESS #3 BYTE BY BYTE |

Figure 11:
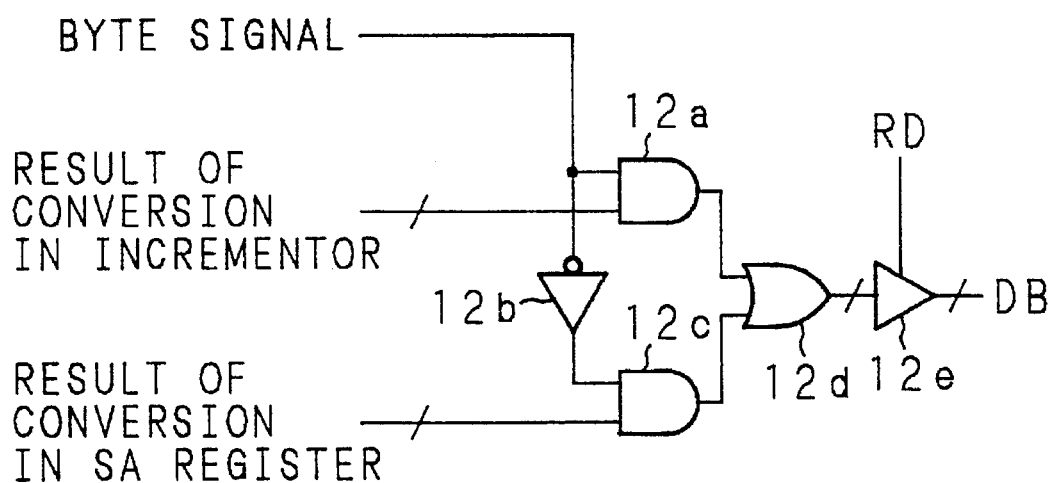
FIG. 11 is a block diagram showing the structure of a byte/word identifying circuit shown in FIG. 10.

When the 16-bit CPU is employed, the circuit shown in FIG. 11 can be used as the byte/word identifying circuit 12 shown in FIG. 10.

A byte signal is inputted to one of the input terminals of an AND circuit 12a and an inverter 12b the output of which is inputted to one of the input terminals of an AND circuit 12c. The result of conversion in the incrementor I is inputted to the other input terminal of the AND circuit 12a, and that of conversion of the SA register 4 is inputted to the other input terminal of the AND circuit 12c. The output of the AND circuits 12a is inputted to one of the input terminal of an OR circuit 12d, and that of the AND circuit 12c is inputted to the other input terminal thereof. The output of the word identifying circuit 14 which identifies the low-order or the high-order, and also a read signal RD. The L/H word identifying circuit 14 receives a lowest-order address signal A0 and a byte signal, and separately outputs the data bus DB for the low-order bits and the data bus DB for the high-order bits.

An A/D converter according to EXAMPLE 4 is characterized in identifying whether the access to the content of conversion to be desired is a byte access in the low-order, a byte access in the high order or a word access. If a low order is accessed in byte, the content of conversion of the low-order eight bits in the SA register 4 are outputted, and if a high order is accessed in byte, the content of conversion of the incrementor I is outputted, and if a high order is accessed by a word, the results of conversion of all the bits in the SA register 4 are outputted.

Figure 13:
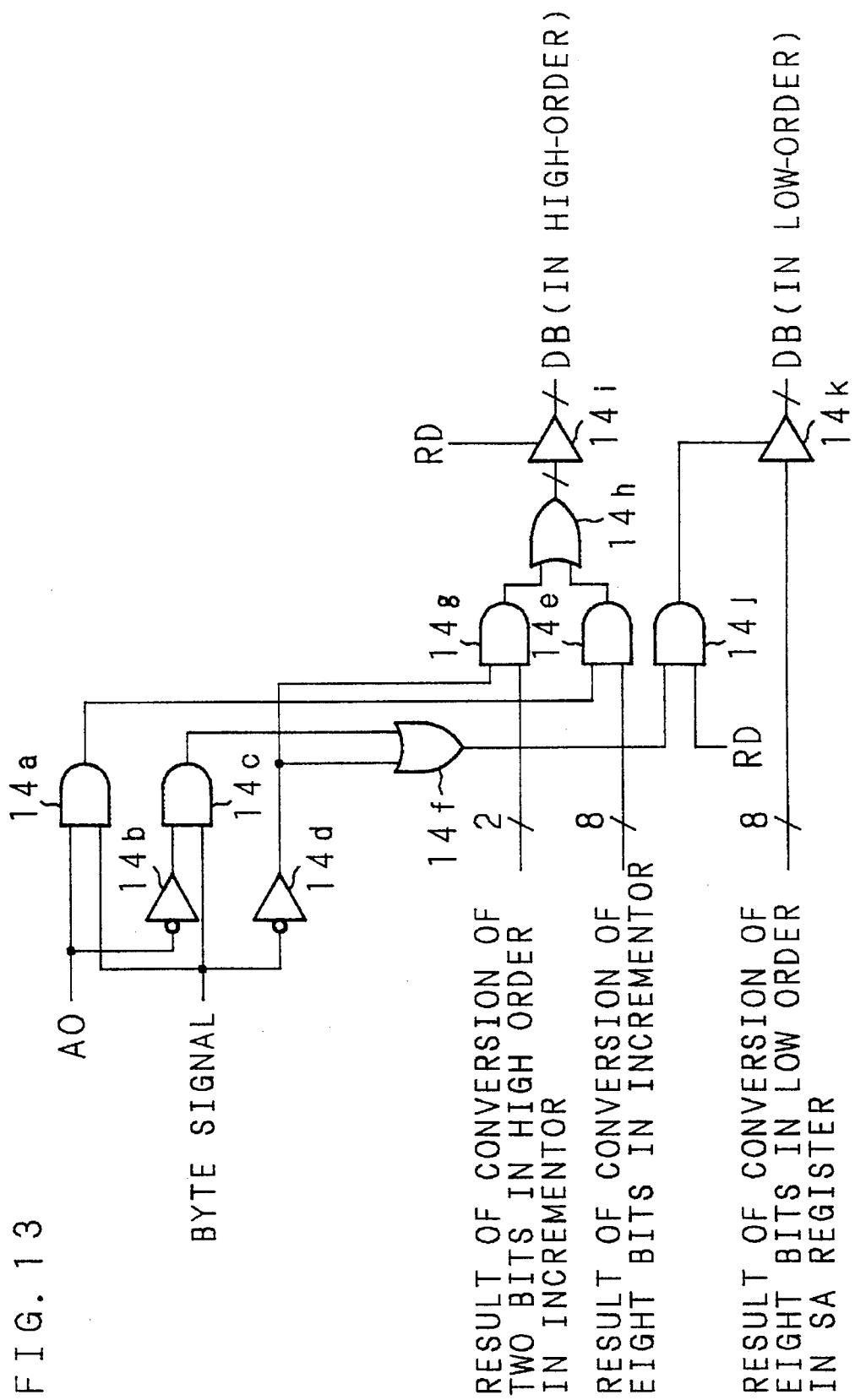
FIG. 13 is a block diagram showing the structures of the L/H word identifying circuit and the selector circuit shown in FIG. 12.

Referring to FIG. 13, the L/H word identifying circuit 14 and the selector circuit 13 will be more particularly described:

The lowest-order address signal A0 is inputted to one of the input terminals of an AND circuit 14a and an inverter 14b the output of which is inputted to one of the input terminals of an AND circuit 14c. A byte signal is inputted to the other input terminal of the AND circuit 14a, the other input terminal of the AND circuit 14c and an inverter 14d. The output of the AND circuit 14a is inputted to one of the input terminals of an AND circuit 14e. The output of the AND circuit 14c is inputted to one of the input terminals of an OR circuit 14f. The output of the inverter 14d is inputted to one of the input terminals of an AND circuit 14g and the other input terminal of the OR circuit 14f. The results of conversion of two bits in the high order in the SA register 4 are input to the other input terminal of the AND circuit 14g. The results of conversion of eight bits in the incrementor I are input to the other input terminal of the AND circuit 14e. The outputs of the AND circuits 14g and 14e are respectively inputted to one of the input terminals of an OR circuit 14h and the other input terminal thereof. The output of the OR circuit 14h is outputted to the data bus DB for the high-order bits through a buffer 14i to which a read signal RD is given. The output of the OR circuit 14f is inputted to one of the input terminals of an AND circuit 14j, and a read signal RD is inputted to the other input terminal thereof. The output of the AND circuit 14j is inputted to a buffer 14k. The results of conversion of eight bits in the low order in the SA register 4 is outputted to the data bus DB for the low-order bits through the buffer 14k.

The A/D convertor according to EXAMPLE 4 is operated as follows:

When a low-order bit is accessed byte by byte, a low-order address signal becomes "0", and the byte signal becomes "1". Thus the output of the AND circuit 14c becomes "1". At this stage, if a read signal RD is generated, the content of conversion of eight bits in the low-order in the SA register 4 is outputted to the data bus DB for the lower order.

If a high-order bit is accessed in byte, the lowest order address signal A0 becomes "1" and the byte signal becomes "1". Thus the output of the AND circuit 14a becomes "1". As a result, the results of conversion of eight bits in the incrementor I are outputted to the data bus DB for the high-order bits.

In the case of word-accessing, the output of the inverter 14d becomes "1" and the results of conversion of two bits in the high order in the SA register 4 are outputted to the data bus DB for the high-order bits, and the results of conversion of eight bits in the low order are outputted to the data DB bus for the low-order bits.

In this way the results of conversion of the eight bits in the low order in the SA register 4, the eight bits in the incrementor I, and all the bits in the SA register 4 are outputted, depending upon various methods of outputting one word by the register.

Depending upon the kinds of applications, the output voltage of the sensor which is applied to the A/D converter almost remains constant only with minute variations. In such cases, it is possible to arrange such that the two bits in the high order are ignored and the results of conversion of eight bits in the low order are commonly outputted, and that only when the output voltage of the sensor exceeds a predetermined range, the results of conversion of the two bits in the high order are outputted.

In EXAMPLE 4, when the results of conversion of low-order bits are to be accessed, the results of conversion of the eight bits in the low order in the SA register 4 are outputted; when the results of conversion of high-order bits are to be accessed, the results of conversion of eight bits in the incrementor I are outputted, and when a data is outputted in word, the results of conversion of all the bits in the SA register 4 are outputted. However, EXAMPLE 4 is not limited to this arrangement but the following modification is possible:

When the results of conversion of low-order bits are to be accessed, the results of conversion of the eight bits in the incrementor 1 may be outputted; when the results of conversion of high-order bits are to be accessed, the results of conversion of two bits in the high order in the SA register 4 may be outputted; and when a data is to be outputted in word, the results of conversion of all the bits in the SA register 4 may be outputted.

In addition, when the results of conversion of low-order bits are to be outputted, the results of conversion of eight bits in the incrementor I may be outputted. When those of high-order bits are to be outputted, the results of conversion of high-order two bits in the SA register 4 may be outputted. When a data is to be outputted in word, the results of conversion of all the bits in the SA register 4 may be outputted.

EXAMPLE 5

Figure 14:
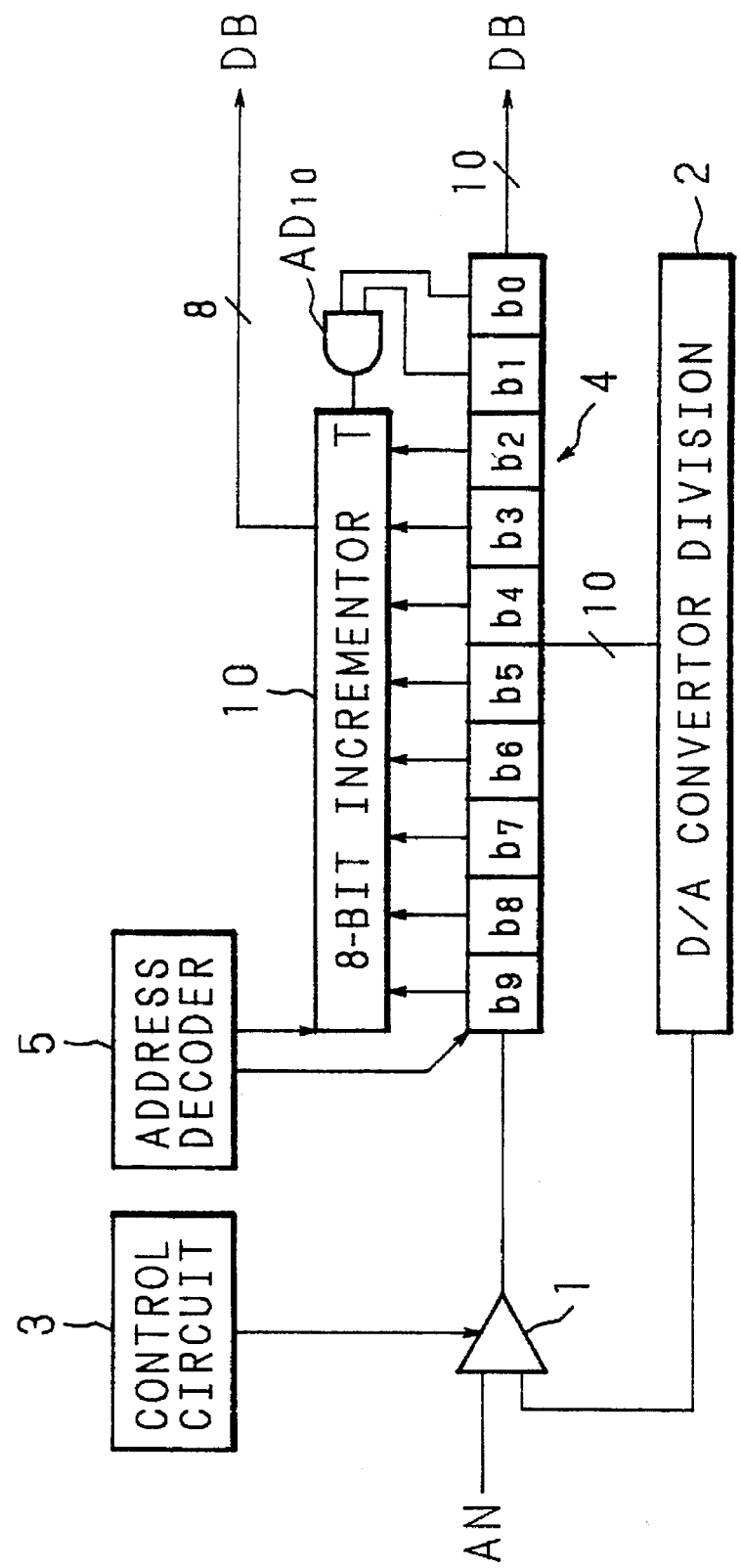
FIG. 14 is a block diagram showing a fifth example of the A/D converter embodying the present invention.

Referring to FIG. 14, wherein like reference numerals designate like elements and components to those in FIG. 4, a fifth example of the embodiment will be described:

The results of conversion of LSB ($b_0$) and the 2nd-bit $b_1$ in a sequential approximation register 4 ("SA register 4") are respectively inputted to one of the input terminals and the other of an AND circuit $AD_{10}$ the output of which is inputted to a trigger terminal T of an incrementor 10.

In EXAMPLE 5, when the results of conversion of two bits in the low order are both "1", the A/D converter compensates the results of conversion of eight bits in the incrementor 10 by adding "1" to each of them, and the results of conversion are shown in TABLE 3:

TABLE 3

| RESULTS OF CONVERSION IN SA REGISTER | | | RESULTS OF CONVERSION INCREMENTOR | |
|---|---|---|---|---|
| $b_9$~$b_6$ | $b_5$~$b_2$ | $b_1$~$b_0$ | $b_9$~$b_6$ | $b_5$~$b_2$ |
| 0 0 0 0 | 0 0 0 0 | 0 0 | 0 0 0 0 | 0 0 0 0 |
| 0 0 0 0 | 0 0 0 0 | 0 1 | 0 0 0 0 | 0 0 0 0 |
| 0 0 0 0 | 0 0 0 0 | 1 0 | 0 0 0 0 | 0 0 0 0 |
| 0 0 0 0 | 0 0 0 0 | 1 1 | 0 0 0 0 | 0 0 0 1 |
| ‖ | ‖ | ‖ | ‖ | ‖ |
| 0 0 0 0 | 1 1 1 1 | 1 1 | 0 0 0 1 | 0 0 0 0 |
| ‖ | ‖ | ‖ | ‖ | ‖ |
| 1 1 1 1 | 1 1 1 1 | 0 1 | 1 1 1 1 | 1 1 1 1 |
| 1 1 1 1 | 1 1 1 1 | 1 0 | 1 1 1 1 | 1 1 1 1 |
| 1 1 1 1 | 1 1 1 1 | 1 1 | 0 0 0 0 | 0 0 0 0 |

Figure 15:
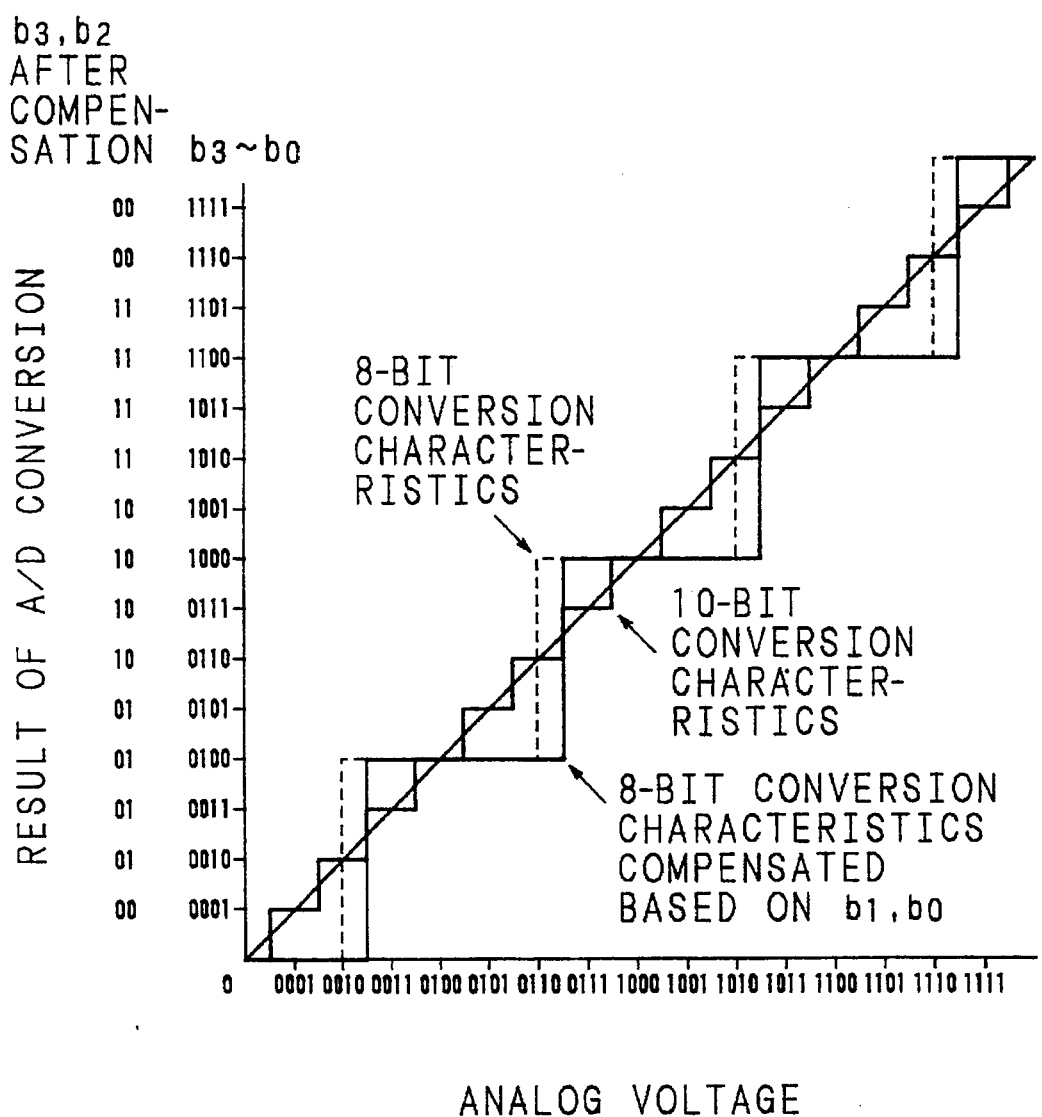
FIG. 15 is a characteristic graph showing the A/D conversion performed by the fifth example.

As a result of it, the compensated results of conversion of eight bits exhibit the characteristics shown in FIG. 15 where the X-axis indicates analog voltages and the Y-axis indicates the results of conversion. The compensated values are plotted in the full stepped lines. The same degree of accuracy is obtained as that available in EXAMPLE 1 but in EXAMPLE 5 errors involved in conversion can be shifted from the negative (−) side (refer to FIG. 6) to the positive (+) side.

The full-scale flag in EXAMPLE 1 can be applied to EXAMPLE 5, and the control system in the output lines shown in FIGS. 9, 10 and 12 can also be applied to Example 5.

EXAMPLE 6

Figure 16:
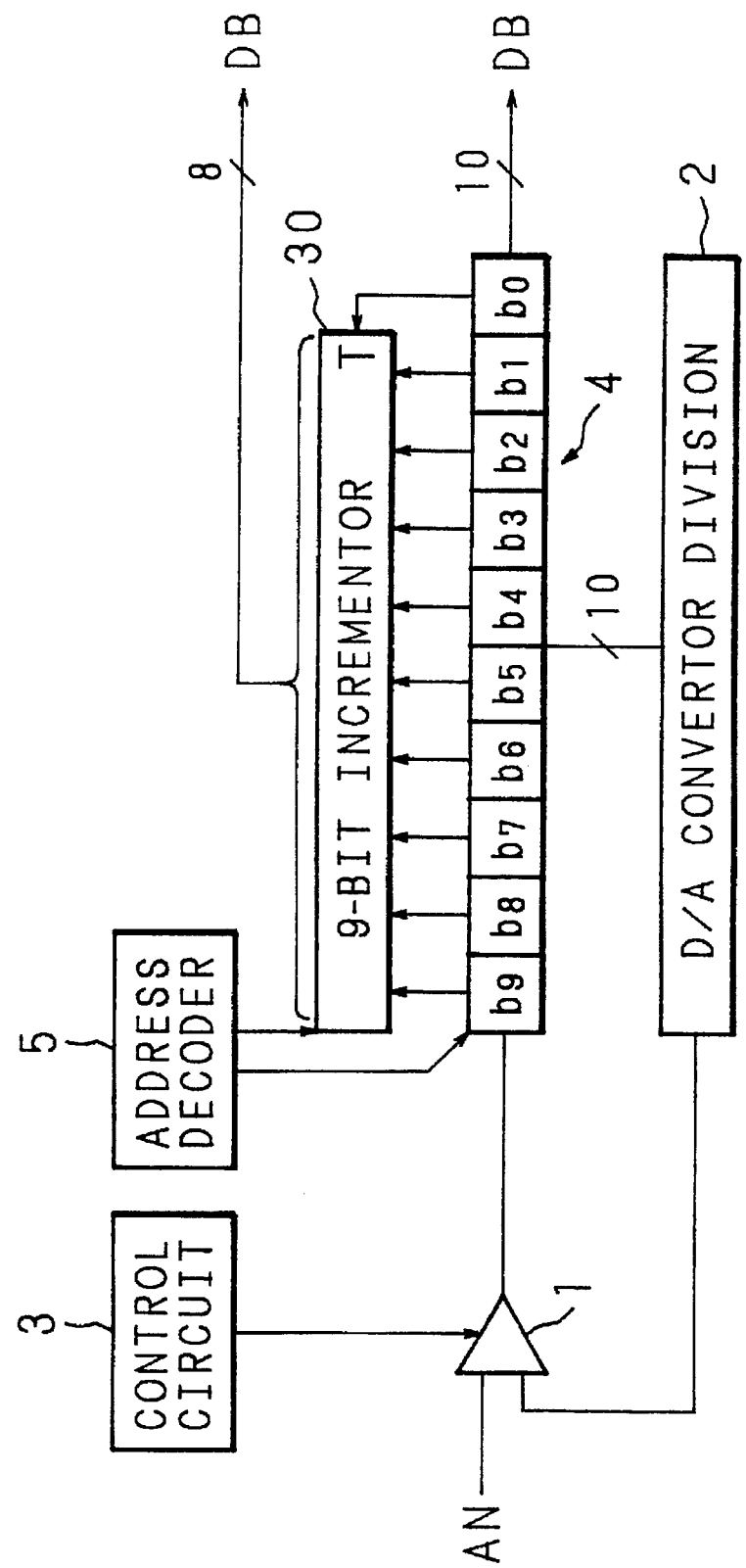

Referring to FIG. 16, wherein like reference numerals designate like elements and components to those in FIG. 4, a sixth example of the embodiment will be described:

The results of conversion of nine bits in the high order in a sequential approximation register 4 ("SA register 4") are inputted to a 9-bit incrementor 30. The results of conversion of LSB ($b_0$) in the SA register 4 are inputted to a trigger terminal T of the incrementor 30 which outputs the results of conversion of eight bits to a data bus DB.

In EXAMPLE 6, Then the results of conversion of the LSB ($b_0$) is "1", the A/D converter compensates the results of conversion of nine bits in the incrementor 30 by adding "1" to each of them. When a compensated result of conversion in the incrementor 30 is outputted, those of high-order eight bits alone are outputted to the data bus DB. In this way, the A/D converter according to EXAMPLE 6 can output the results of conversion in the same manner as EXAMPLE 5 shown in FIG. 14.

The full-scale flag in EXAMPLE 1 can be applied to EXAMPLE 6, and the control system in the output lines shown in FIGS. 9, 10 and 12 can also be applied to Example 6. The incrementor shown in FIGS. 9, 10 and 12 is a 9-bit incrementor 30 which receives the results of conversion of the least significant bit (LSB) at its trigger terminal T.

EXAMPLE 7

Referring to FIG. 17, a seventh example of the embodiment will be described:

The results of conversion of two bits $b_1$ and $b_0$ in the low order in a sequential approximation register 4 ("SA register 4") are inputted to one of the input terminals of an AND circuit $AD_{11}$ and the other input terminal thereof the output of which is inputted to a trigger terminal T of an 8-bit incrementor 10 through a selector circuit SEL. The results of conversion of the 2nd bit $b_1$ in the low order in the SA register 4 are inputted to the trigger terminal T of the incrementor 10 through the selector circuit SEL. The selector circuit SEL receives data for switching the selector circuit SEL so as to allocate an error to a plus side or a minus side, the data being stored in a +/−error switching register 15.

Briefly stated, EXAMPLE 7 is a combination of EXAMPLES 1 and 5. Thus, errors of +(1/8) LSB and −(1/8) LSB can be changed from one to the other as desired by sending a data from the +/−error switching register 15. EXAMPLE 7 is advantageous in that a single A/D converter enable the operator to choose a plus side error or a minus side error.

The full scale flag in EXAMPLE 1 shown in FIG. 4, can be applied to this EXAMPLE 7. In addition, the control system in the output lines shown in FIGS. 9, 10 and 12 can be also applied to EXAMPLE 7, thereby selecting the results of conversion between the structure of register 4 and that of the incrementor I.

EXAMPLE 8

Referring to FIG. 18, wherein like reference numerals designate like elements and components to those in FIG. 9, an eighth example of the embodiment will be described:

There is provided an 8/10-bit switching register 16 which stores a data for selecting in which bit form the results of conversion are outputted, in 8-bit or in 10-bit. The data is given to a selector circuit SEL and a D/A conversion division 2. A sequential approximation SA register 4 and an incrementor I may have the same structure as any of those of EXAMPLES 1, 5, 6, and 7.

The A/D converters according to EXAMPLES 1, through 7 involves an error of +(1/8) LSB or −(1/8) LSB, but EXAMPLE 8 avoids the occurrence of these errors by stopping the operation of a (1/2) LSB compensating circuit which conducts the 10-bit A/D conversion. The above-mentioned A/D converters are operated as a 10-bit A/D converter; in contrast in EXAMPLE 8 it is possible to select an 8-bit A/D conversion or a 10-bit A/D conversion prior to starting the A/D conversion. To achieve this objective, when the 10-bit A/D conversion is carried out, the same operation as those mentioned above follows, and when the 8-bit A/D conversion is carried out, the (1/2) LSB compensation performed by the (1/2) LSB compensating circuit in the 10-bit A/D converter is stopped.

The manner of stopping the (1/2) LSB compensation will be described by way of a 2-bit A/D converter with reference to FIG. 19 which shows a ladder resistor circuit in the D/A conversion division:

Eight registers $R_1$ through $R_8$ having the same resistance are connected across the reference voltage $V_{ref}$ and the ground voltage $V_{SS}$. A tap voltage 3/4 $V_{ref}$ at the connection of the registers $R_2$ and $R_3$ is inputted to a comparator (not shown) through an open/closed circuit $S_1$. Likewise, a tap voltage 2/4 $V_{ref}$ at the connection of the registers $R_4$ and $R_5$ is inputted to the comparator through an open/closed circuit $S_2$, and a tap voltage 1/4 $V_{ref}$ at the connection of the registers $R_6$ and $R_7$ is inputted to the comparator through an open/closed circuit $S_3$.

A tap voltage 5/8 $V_{ref}$ at the connection of the resisters $R_3$ and $R_4$ is applied to the comparator through an open/closed circuit $S_4$. Likewise, a tap voltage 3/8 $V_{ref}$ at the connection of the resisters $R_5$ and $R_6$ is applied to the comparator through an open/closed circuit $S_5$, and a tap voltage 1/8 $V_{ref}$ at the connection of the resisters $R_7$ and $R_8$ is applied to the comparator through an open/closed circuit $S_6$.

In order to effect the (1/2) LSB compensation, the ladder resistor circuit commonly applies tap voltages 1/8 $V_{ref}$, 3/8 $V_{ref}$ and 5/8 $V_{ref}$ to the comparator. The resulting D/A conversions are shown in FIG. 20, and with the (1/2) LSB compensation added, the resulting D/A conversion exhibits almost ideal characteristics which can be depicted virtually in a straight line.

If the tap voltages 1/4 $V_{ref}$, 2/4 $V_{ref}$, and 3/4 $V_{ref}$ are used to effect the A/D conversion, the results of conversion are shown in FIG. 21. The A/D converter according to EXAMPLE 8 can take both a voltage to which the (1/2) LSB compensation was added as shown in FIG. 19 and a voltage to which no (1/2) LSB compensation was added. The results obtained when the A/D conversion was practiced by an 8-bit A/D converter without the (1/2) LSB compensation as shown in FIG. 22. With reference to FIG. 19 a 2-bit A/D converter is described by way of example but a 10-bit A/D converter can be used in the same manner on the same principle where the number of the ladder resistors increases.

In the A/D converter shown in FIG. 18 the tap voltage having no (1/2) LSB compensation may be taken and applied to the comparator 1 in the 8-bit mode.

EXAMPLE 8 provides a version of A/D converters in which the (1/2) LSB compensation is effected in the D/A converting division but there are A/D converters in which the (1/2) LSB compensation is carried out in the comparator 1. These A/D converters can be modified into the model of EXAMPLE 8 by adding a circuit which does not carry out the (1/2) LSB compensation in the 8-bit mode. The full-scale flag used in EXAMPLE 1 shown FIG. 4 can be applied to EXAMPLE 8.

EXAMPLE 9

Referring to FIG. 23, wherein like reference numerals designate like elements and components to those in FIG. 9, a ninth example of the embodiment will be described:

A data for selecting the results of conversion of eight bits or ten bits stored in an 8/10-bit switching register 11 is inputted to a D/A converting division 2 and the 2nd-bit $b_1$ in the low order in a sequential approximation register 4 ("SA register 4"). The SA register 4 and the incrementor I may have the same structure as any of those of the sequential approximation registers and the incrementors in EXAMPLES 1, 5, 6 and 7.

As described above, when the A/D converter shown in FIG. 18 is operated in a mode where the results of conversion of eight bits are outputted, the results of conversion of ten bits cannot be obtained because the (1/2) LSB compensation is not practiced, in which the A/D converter of FIG. 18 is different from the A/D converters of FIGS. 9, 10, 12, 14, 16 and 17. In other words, in order to obtain the results of conversion of eight bits, the nine bits $b_9$ to $b_1$ in the high order are only used, and the LSB ($b_0$) is not used at all.

In EXAMPLE 9, in order to speed up the A/D conversion, the A/D conversion is finished as soon as the comparing operation of the 2nd-bit $b_1$ in the low order is finished. To this end, when the results of conversion of eight bits are outputted by the A/D converter of EXAMPLE 9, a data DT from an 8/10-bit switching register 11 becomes active, thereby stopping the (1/2) LSB compensation. The data is also inputted to the SA register 4, thereby allowing the A/D conversion to finish when the SA register 4 finishes the conversions up to the bit $b_1$. The termination of the A/D conversion is signalled to a CPU by setting an end flag or generating an interrupt signal. EXAMPLE 9 can shorten a period of time required for performing A/D conversion only by setting an end flag or generating an interrupt signal when the SA register 4 finishes the conversion of the bit $b_1$ without actually completing the A/D conversion.

EXAMPLE 10

Referring to FIG. 24, wherein like reference numerals designate like elements and components to those in FIG. 18, a tenth example of the embodiment will be described:

A first analog voltage $AN_1$ and a second analog voltage $AN_2$ are inputted to one of the input terminals of a comparator 1 respectively through an open/closed switching circuits $S_{10}$ and $S_{11}$. A data stored in an 8/10-bit switching register 16 for the analog voltage $AN_1$ and a data stored therein for the analog voltage $AN_2$ are inputted to a selector circuit SEL and a D/A convertor division 2 respectively through open/closed switching circuits $S_{12}$ and $S_{13}$. An analog voltage selecting data stored in an analog input selecting register 17 is inputted to each of the open/closed switching circuits $S_{10}$ to $S_{13}$ as a switching signal. A sequential approximation register 4 ("SA register 4") and an incrementor I may have the same structure as that of the SA register 4 and incrementor I used in each of EXAMPLES 1, 5, 6 and 7.

There are A/D converters which can be started in several manners; for example, by a software accessed by a CPU, by expiry of a period of time set by a timer, and by an external trigger in response to a change in a signal from an external terminal. In these A/D converters it is difficult to set previously so as to select the results of conversion of eight bits or those of ten bits because they are triggered in non-synchronism owing to the several starting factors. In order to solve this problem, 8/10-bit switching resisters are provided for each analog voltage, and when any of the starting factors occurs, either of the results of conversion of eight bits or ten bits can be selected.

With reference to FIG. 24, EXAMPLE 10 has been described when two kinds of analog voltages are dealt with, where the number of 8/10-bit switching registers corresponding to that of the kinds of analog voltage. The embodiment is not limited to the case where two analog voltages are dealt with but can be applied to cases where more than two analog voltages are dealt with.

If an application requires it, the analog voltages $AN_1$ and $AN_2$ as a result of A/D conversion in 8-bit and 10-bit, respectively, can be fixed as a hardware.

The block diagrams shown in each of EXAMPLES 1 to 10 are examples only for comparing the present invention with the prior art, and many variations are of course possible within the spirit of the present invention.

In each of EXAMPLES 1 to 10 a 10-bit A/D converter is used as an 8-bit A/D converter, but the order of bits is not limited to them; for example, an 11-bit A/D converter may be used as an 8-bit A/D converter, or a 6-bit A/D converter as a 4-bit A/D converter.

As is evident from the foregoing description, according to the present invention there are provided a sequential approximation register which stores the results of comparison between the analog voltage and the comparison reference voltage, and an incrementor which has a smaller order of bits than that of the sequential approximation register and adds "1" to each of the results of conversion in a predetermined bit from the low order in the sequential approximation register, thereby compensating the results of conversion inputted to the incrementor from the register. In this way, the accuracy of A/D conversion is enhanced irrespective of the lower bit order than that in the sequential approximation register.

EXAMPLE 1 can be embodied by providing a simplified circuit with the addition of an incrementor. According to EXAMPLE 4, the identifying circuit distinctly reads out the results of conversion in the high-order bit and those in the low-order bit, and in addition, selectively reads out the results of conversion in and of the other bits excluding the high-order two bits in the sequential approximation register, the results of conversion of the incrementor or the results of conversion in all bits in the sequential approximation register.

According to EXAMPLE 5, an error in the results of conversion in the incrementor can be shifted from the negative side to the positive side.

According to EXAMPLE 6, the accuracy of the results of conversion of bits less than the bits in the sequential approximation register can be enhanced.

According to EXAMPLE 7, an error in the results of conversion in the incrementor can be changed to an error on the positive side or to an error on the negative side.

According to EXAMPLE 8, when the results of conversion in the incrementor are selected, the (1/2) LSB compensation performed by the sequential approximation register is stopped, thereby enhancing the accuracy of results of conversion.

According to EXAMPLE 9, when the results of conversion in the incrementor are to be selected, the (1/2) LSB compensation performed by the sequential approximation register is stopped, thereby enhancing the accuracy of the results of conversion, and the operation of A/D conversion can be terminated as soon as the conversion in the 2nd bit in the low order in the sequential approximation register finishes.

According to EXAMPLE 10, analog voltage applied to a plurality of terminals is selected, and the results of conversion in the incrementor or those of the sequential approximation register can be selected in correspondence to the selected terminal.

As this invention may be embodied in several forms without departing from the spirit of essential characteristics thereof, each examples of the embodiment are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An analog/digital (A/D) converter for converting analog voltage into digital values by comparing the analog voltage with a comparison voltage obtained by dividing a reference voltage, the A/D converter comprising:
    a sequential approximation register (SA register) having a plurality of bits for storing results of conversion in digits;
    an incrementor having a smaller number of bits than that of the SA register, the incrementor receiving a portion of the results of conversion in the SA register corresponding to the same number of high-order bits containing a most significant bit (MSB) as the bits of its own and a data about at least one low-order bit in the SA register, and incrementing the result of conversion inputted thereto from the SA register on the basis of the data; and
    a digital/analog converting division for dividing the reference voltage into the comparison voltage on the basis of the results of conversion in the SA register inputted thereto.

2. The analog/digital converter according to claim 1, wherein the incrementor increments the result of conversion from the SA register on the basis of the data about the least significant bit (LSB) in the SA register.

3. The analog/digital converter according to claim 1, wherein the incrementor increments the result of conversion from the SA register on the basis of the data about the 2nd bit from the least significant bit (LSB).

4. The analog/digital converter according to claim 1, further comprising an AND circuit to which the result of conversion of each of the 1st and 2nd bits from the least significant bit (LSB) in the SA register is inputted, and wherein the incrementor increments a portion of the results of conversion inputted thereto in response to an output from the AND circuit.

5. The analog/digital converter according to claim 1, further comprising:
    an AND circuit to which the result of conversion of each of the 1st and 2nd bits from the least significant bit (LSB) in the SA register is inputted; and
    a selector circuit for alternatively selecting either the result of conversion of the 2nd bit from the least significant bit (LSB) in the SA register or an output from the AND circuit,
    wherein the incrementor increments the result of conversion inputted thereto on the basis of an output from the selector circuit.

6. The analog/digital converter according to claim 1, wherein the incrementor comprises a full-scale flag.

7. The analog/digital converter according to claim 1, wherein the incrementor operates such that when all the bits therein become "1", the state of "1" is maintained.

8. The analog/digital converter according to claim 1, further comprising a selector circuit for alternatively selecting the result of conversion either in the SA register or in the incrementor.

9. The analog/digital converter according to claim 1, further comprising:
    a switching register for storing data whereby the results of conversion either in the SA register or in the incrementor is alternatively selected depending upon the number of bits of the results of conversion to be read out; and
    a selector circuit to which the results of conversion in the SA register and the incrementor are inputted, the selector circuit alternatively selecting the results of conversion either in the SA register or in the incrementor on the basis of the data from the switching register.

10. The analog/digital converter according to claim 1, further comprising a byte/word identifying circuit to which the results of conversion both in the SA register and in the incrementor are inputted, the byte/word identifying circuit identifying whether the result of conversion to be read out is represented in bytes or words and alternatively selecting the result of conversion in bytes or in words based on the result of identification.

11. The analog/digital converter according to claim 1, further comprising:
    a selector circuit for selectively outputting the results of conversion of high-order bits containing a most significant bit (MSB) in the SA register, the results of conversion of other bits excluding the high-order bits in the SA register, or the results of conversion in the incrementor; and
    an identifying circuit for identifying which the results of conversion to be read out are represented in high-order bits or low-order bits, and instructing the selector circuit to output the identified result of conversion.

12. The analog/digital converter according to claim 1, further comprising:
    a selector circuit to which the results of conversion of high-order bits in the SA register, the results of conversion of other bits excluding the high-order bits containing a most significant bit (MSB) in the SA register, or the results of conversion in the incrementor are inputted and which selectively outputs one of these results of conversion; and
    an identifying circuit for identifying which the result of conversion to be read out is read in high-order bits, low-order bits or words, and sending the result of identification to the selector circuit,
    wherein the selector circuit outputs the results of conversion in the incrementor when the high-order bits are identified, outputs the results of conversion of others than the high-order bits when the low-order bit are identified and outputs the results of conversion of all the bits in the SA register when the words are identified.

13. The analog/digital converter according to claim 1, further comprising:

a switching register for storing data whereby the results of conversion in the SA register or in the incrementor is alternatively selected depending upon the number of bits of the results of conversion to be read out; and a selector circuit to which the results of conversion in the SA register and the incrementor are inputted, the selector circuit alternatively selecting the results of conversion either in the SA register or in the incrementor on the basis of the data from the switching register, wherein the digital/analog converting division receives data from the switching register and divides the reference voltage into the comparison voltage on the basis of the results of conversion in the SA register inputted thereto.

14. The analog/digital converter according to claim 1, further comprising:

a switching register for storing data whereby the results of conversion either in the SA register or in the incrementor is alternatively selected depending upon the number of bits of the results of conversion to be read out; and a selector circuit to which the results of conversion in the SA register and the incrementor are inputted, the selector circuit alternatively selecting the results of conversion either in the SA register or the incrementor on the basis of the data from the switching register, wherein the digital/analog converting division receives data from the switching register and divides the reference voltage into the comparison voltage on the basis of the data, and wherein the SA register stops the A/D conversion on the basis of the data from the switching register.

15. The analog/digital converter according to claim 1, further comprising:

a plurality of input terminals to each of which the analog voltage is inputted;

a plurality of switching registers each for storing data whereby the results of conversion either in the SA register or in the incrementor is alternatively selected depending upon the number of bits of the results of conversion to be read out; and a selector circuit to which the results of conversion in the SA register and the incrementor are inputted, the selector circuit selecting the results of conversion either in the SA register or in the incrementor on the basis of the data from the switching register.

16. The analog/digital converter according to claim 15, wherein the same number of switching registers as that of the input terminals are provided.

* * * * *